(12) United States Patent
Chen et al.

(10) Patent No.: US 11,496,238 B2
(45) Date of Patent: Nov. 8, 2022

(54) DATA TRANSMISSION METHOD AND COMMUNICATIONS DEVICE

(71) Applicant: Huawei Technologies Co., Ltd., Shenzhen (CN)

(72) Inventors: Ying Chen, Hangzhou (CN); Rongdao Yu, Shenzhen (CN); Yunfei Qiao, Hangzhou (CN); Hejia Luo, Hangzhou (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/356,837

(22) Filed: Jun. 24, 2021

(65) Prior Publication Data

US 2021/0320748 A1 Oct. 14, 2021

Related U.S. Application Data

(63) Continuation of application No. PCT/CN2019/121379, filed on Nov. 27, 2019.

(30) Foreign Application Priority Data

Dec. 25, 2018 (CN) .......................... 201811596384.2

(51) Int. Cl.
 *H04L 1/00* (2006.01)
 *H04B 7/185* (2006.01)
(52) U.S. Cl.
 CPC ....... *H04L 1/0009* (2013.01); *H04B 7/18513* (2013.01); *H04L 1/003* (2013.01); *H04L 1/0029* (2013.01); *H04L 1/0043* (2013.01)
(58) Field of Classification Search
 CPC ..... H04L 1/0009; H04L 1/0029; H04L 1/003; H04L 1/0043; H04L 1/0016;
 (Continued)

(56) References Cited

U.S. PATENT DOCUMENTS 7,113,748 B2  9/2006 Shapira et al.
8,989,289 B2  3/2015 Macrae
(Continued)

FOREIGN PATENT DOCUMENTS

CN 105680987 A 6/2016
CN 106233794 A 12/2016
(Continued)

OTHER PUBLICATIONS

"Polar Code Information Bit Allocation and Nested Extension Construction," Agenda Item: 8.1.4.2.1, Source: Qualcomm Incorporated, Document for: Discussion and Decision, 3GPP TSG-RAN WG1 Meeting #88, R1-1702646, Feb. 13-17, 2017, 13 pages.
(Continued)

*Primary Examiner* — Hirdepal Singh
(74) *Attorney, Agent, or Firm* — Slater Matsil, LLP

(57) ABSTRACT

A data transmission method and a communications device, the method including: determining, by a first communications device, a target data transmission mode, where the target data transmission mode is used to indicate a quantity of times that the first communications device transmits an encoded-bit combination to a second communications device and an encoded-bit combination transmitted each time, the encoded-bit combination transmitted each time may include one encoded bit sequence or a plurality of encoded bit sequences, where the encoded bit sequence is obtained by encoding all or some of K information bits, and K is a positive integer, and sending, by the first communications device, the encoded-bit combination to the second communications device in the target data transmission mode, and receiving, by the second communications device, the encoded-bit combination sent by the first communications device, and decoding the encoded bit sequence included in the encoded-bit combination.

18 Claims, 9 Drawing Sheets

(58) Field of Classification Search
CPC ....... H04L 1/1607; H04L 1/08; H04L 1/0041; H04L 1/0057; H04L 1/007; H04L 1/0086; H04B 7/18513; H03M 13/13; H03M 13/6306; H04W 72/04
USPC .......................................................... 455/427
See application file for complete search history.

(56) References Cited

U.S. PATENT DOCUMENTS

| | | | |
|---|---|---|---|
| 9,331,815 B2 | 5/2016 | Muramoto et al. | |
| 10,574,401 B2 | 2/2020 | Li et al. | |
| 10,826,651 B2 | 11/2020 | Ma et al. | |
| 11,019,623 B2 | 5/2021 | Lee et al. | |
| 2015/0194987 A1 | 7/2015 | Li et al. | |
| 2018/0034593 A1* | 2/2018 | Xu | H04L 5/0044 |
| 2018/0198560 A1 | 7/2018 | Jiang et al. | |
| 2019/0207710 A1* | 7/2019 | Ye | H04L 1/1819 |
| 2019/0207720 A1 | 7/2019 | Li et al. | |
| 2020/0067525 A1* | 2/2020 | Jayasinghe | H03M 13/13 |
| 2021/0099213 A1* | 4/2021 | Chen | H04L 1/0009 |

FOREIGN PATENT DOCUMENTS

| | | |
|---|---|---|
| CN | 106817195 A | 6/2017 |
| CN | 107666369 A | 2/2018 |
| CN | 107819545 A | 3/2018 |
| CN | 107896389 A | 4/2018 |
| CN | 108111252 A | 6/2018 |
| CN | 108400857 A | 8/2018 |
| CN | 108429602 A | 8/2018 |
| CN | 108494526 A | 9/2018 |
| CN | 108737021 A | 11/2018 |
| EP | 1279234 A2 | 1/2003 |
| JP | 2008295070 A | 12/2008 |
| JP | 2017011402 A | 1/2017 |
| JP | 2019515592 A | 6/2019 |
| JP | 2019531001 A | 10/2019 |
| JP | 2020515186 A | 5/2020 |
| RU | 2651805 C2 | 4/2018 |
| WO | 0108682 A2 | 2/2001 |
| WO | 2013183236 A1 | 12/2013 |
| WO | 2017193281 A1 | 11/2017 |
| WO | 2018029628 A1 | 2/2018 |
| WO | 2018031777 A1 | 2/2018 |
| WO | 2018045849 A1 | 3/2018 |
| WO | 2018172136 A1 | 9/2018 |
| WO | 2018228236 A1 | 12/2018 |
| WO | 2018228579 A1 | 12/2018 |

OTHER PUBLICATIONS

"HARQ Scheme for Polar Codes," Agenda Item: 8.1.4.1, Source: Huawei, HiSilicon, Document for: Discussion and Decision, 3GPP TSG RAN WG1 Meeting #86, R1-167210, Gothenburg, Sweden, Aug. 22-26, 2016, 4 pages.

* cited by examiner

DATA TRANSMISSION METHOD AND COMMUNICATIONS DEVICE

CROSS-REFERENCE TO RELATED APPLICATIONS

This application is a continuation of International Patent Application No. PCT/CN2019/121379, filed on Nov. 27, 2019, which claims priority on Chinese Patent Application No. 201811596384.2, filed on Dec. 25, 2018. The disclosures of the aforementioned applications are hereby incorporated by reference in their entireties.

TECHNICAL FIELD

This application relates to the field of wireless communications technologies, and in particular, to a data transmission method and a communications device.

BACKGROUND

A satellite base station is capable of providing a wider coverage area and is not vulnerable to a natural disaster or an external force. If satellite communication is introduced to future $5^{th}$ generation (5G) communication, communication services can be provided for some areas that cannot be covered by terrestrial communications networks, such as oceans and forests, to enhance reliability of the 5G communication. In this way, for example, better communication services can be provided for aircrafts, trains, and users on these transportation vehicles. More data transmission resources are provided for the 5G communication, to improve a network rate. Therefore, supporting communication with both the ground and a satellite is an inevitable trend of the future 5G communication, and has great benefits in terms of wide coverage, reliability, multi-connection, a high throughput, and the like.

Currently, the satellite communication and terrestrial communication greatly differ in terms of a communications protocol. A common terminal device such as a mobile phone can support only baseline communication with a terrestrial base station, and only a dedicated satellite mobile phone can communicate with the satellite. In the 5G communication, a satellite communication process needs to be redesigned, so that the satellite communication process can be integrated with the existing terrestrial communication, and does not greatly increase costs or complexity of a terminal device. During communication, a terminal only needs to select an appropriate base station based on a corresponding requirement.

To improve communication reliability, in an existing long term evolution (LTE) network, a relatively complex hybrid automatic repeat request (HARQ) mechanism is provided to transmit a signal for a plurality of times until a receive end successfully performs decoding or a maximum quantity of retransmission times is reached. Specifically, a plurality of encoded redundancy versions are generated during channel coding, and a redundancy version different from a previous redundancy version is sent in each retransmission. The redundancy version herein means that a part of encoded data is combined at the receive end, to improve decoding performance. However, because the satellite communication is typically characterized by a long transmission distance and a large latency, if the HARQ mechanism in LTE continues to be used, a latency is greatly increased, and communication efficiency is severely affected. Currently, some satellite communications systems do not directly support the HARQ mechanism, to reduce the latency. However, as the satellite communication and the terrestrial communication are integrated, and a user has an increasingly high reliability requirement for communication data, a new transmission mechanism needs to be considered to be applicable to the satellite communication. Therefore, how to design a data transmission method applicable to the satellite communication to improve efficiency of the satellite communication is a technical problem that needs to be resolved currently.

SUMMARY

This application provides a data transmission method and a communications device, so that a data transmission mode can be adaptively selected, and applicability is wider. This is not only applicable to a terrestrial base station, but also applicable to satellite communication, and can ensure both communication reliability and communication transmission efficiency.

According to a first aspect, an embodiment of this application provides a data transmission method, applied to a first communications device side. The method includes determining, by the first communications device, a target data transmission mode, where the target data transmission mode is used to indicate a quantity of times that the first communications device transmits an encoded-bit combination to a second communications device and an encoded-bit combination transmitted each time, the encoded-bit combination transmitted each time includes one encoded bit sequence or a plurality of encoded bit sequences, the encoded bit sequence is obtained by encoding all or some of K information bits, and K is a positive integer, and sending, by the first communications device, the encoded-bit combination to the second communications device in the target data transmission mode.

According to this embodiment of this application, the first communications device sends the encoded-bit combination to the second communications device in the target data transmission mode. The target data transmission mode can be used to indicate the quantity of times that the first communications device transmits the encoded-bit combination to the second communications device and the encoded-bit combination transmitted each time. Therefore, in this embodiment of this application, a data transmission mode can be adaptively selected, and applicability is wider. This is not only applicable to a terrestrial base station, but also applicable to satellite communication, and can ensure both communication reliability and communication transmission efficiency.

In a possible design, an encoded-bit combination in at least one transmission in the encoded-bit combination transmitted each time includes at least two encoded bit sequences. According to this embodiment of this application, in a single transmission process, at least two encoded bit sequences may be combined and sent. This improves a decoding success rate.

In a possible design, when the encoded-bit combination transmitted each time includes the plurality of encoded bit sequences, at least one of the plurality of encoded bit sequences is obtained by encoding some information bits of the K information bits.

In a possible design, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on reliability, when the Q information bits are encoded by using the polar code, to obtain the second encoded bit sequence, the Q information bits are mapped to the first Q polarized channels of the P polarized channels that are sorted based on the reliability, and Q is a positive integer less than or equal to P. According to this embodiment of this application, the Q information bits corresponding to the last Q polarized channels that are sorted based on the reliability are mapped to the first Q polarized channels of the P polarized channels that are sorted based on the reliability. This can ensure a decoding success rate of each information bit.

In a possible design, the Q information bits are mapped, in ascending reliability order, to the Q polarized channels whose reliability is in descending order, or the Q information bits are mapped, in descending reliability order, to the Q polarized channels whose reliability is in descending order.

In a possible design, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on a code distance and reliability, when the Q information bits are encoded by using the polar code, to obtain the second encoded bit sequence, the Q information bits are mapped to the first Q polarized channels of the P polarized channels that are sorted based on the code distance and the reliability, and Q is a positive integer less than or equal to P. According to this embodiment of this application, a decoding success rate of each information bit can be ensured.

In a possible design, the Q information bits are mapped, in ascending code distance and reliability order, to the Q polarized channels whose code distances and reliability are in descending order, or the Q information bits are mapped, in descending code distance and reliability order, to the Q polarized channels whose code distances and reliability are in descending order.

In a possible design, the first communications device is a terminal and the second communications device is a network device, or the first communications device is a network device and the second communications device is a terminal, before the determining, by a first communications device, a target data transmission mode, the method further includes receiving, by the first communications device, a first index sent by the second communications device, where the first index is determined by the second communications device based on attribute information of the network device and/or quality of a channel between the first communications device and the second communications device, the attribute information includes one or more of a type of the network device, a distance between the first communications device and the second communications device, or a height from the network device to the ground, and the type includes a terrestrial base station or a non-terrestrial base station, and the determining, by a first communications device, a target data transmission mode includes determining, by the first communications device, the target data transmission mode based on the first index and a preset mapping table, where the preset mapping table includes a mapping relationship between at least one index and at least one data transmission mode, the at least one index includes the first index, and the at least one data transmission mode includes the target data transmission mode.

In a possible design, the first communications device is a terminal and the second communications device is a network device, or the first communications device is a network device and the second communications device is a terminal, and the determining, by a first communications device, a target data transmission mode includes determining, by the first communications device, the target data transmission mode based on attribute information of the network device and/or quality of a channel between the first communications device and the second communications device, where the attribute information includes one or more of a type of the network device, a distance between the first communications device and the second communications device, or a height from the network device to the ground, and the type includes a terrestrial base station or a non-terrestrial base station. According to this embodiment of this application, compared with a manner in which the network device determines the target data transmission mode, the manner in this embodiment of this application can reduce signaling overheads and improve communication transmission efficiency.

In a possible design, a quantity that is of times of encoded-bit combination transmission and that corresponds to the non-terrestrial base station is less than or equal to a quantity that is of times of encoded-bit combination transmission and that corresponds to the terrestrial base station, and/or a quantity that is of encoded bit sequences included in the encoded-bit combination transmitted each time and that corresponds to the non-terrestrial base station is greater than or equal to a quantity that is of encoded bit sequences included in the encoded-bit combination transmitted each time and that corresponds to the terrestrial base station.

In a possible design, at least two of a plurality of encoded bit sequences included in a same encoded-bit combination have different code rates.

According to a second aspect, an embodiment of this application provides a data transmission method, applied to a second communications device side. The method includes receiving, by a second communications device, an encoded-bit combination sent by a first communications device in a target data transmission mode, where the target data transmission mode is used to indicate a quantity of times that the first communications device transmits the encoded-bit combination to the second communications device and an encoded-bit combination transmitted each time, the encoded-bit combination transmitted each time includes one encoded bit sequence or a plurality of encoded bit sequences, the encoded bit sequence is obtained by encoding all or some of K information bits, and K is a positive integer, and decoding, by the second communications device, the received encoded-bit combination to obtain a decoded bit sequence.

According to this embodiment of this application, a data transmission mode can be adaptively selected, and applicability is wider. This is not only applicable to a terrestrial base station, but also applicable to satellite communication, and can ensure both communication reliability and communication transmission efficiency.

In a possible design, an encoded-bit combination in at least one transmission in the encoded-bit combination transmitted each time includes at least two encoded bit sequences. According to this embodiment of this application, in a single transmission process, at least two encoded bit sequences may be combined and sent. This improves a decoding success rate.

In a possible design, when the encoded-bit combination transmitted each time includes the plurality of encoded bit sequences, at least one of the plurality of encoded bit sequences is obtained by encoding some information bits of the K information bits.

In a possible design, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on reliability, when the Q information bits are encoded by using the polar code, to obtain the second encoded bit sequence, the Q information bits are mapped to the first Q polarized channels of the P polarized channels that are sorted based on the reliability, and Q is a positive integer less than or equal to P. According to this embodiment of this application, a decoding success rate of each information bit can be ensured.

In a possible design, the Q information bits are mapped, in ascending reliability order, to the Q polarized channels whose reliability is in descending order, or the Q information bits are mapped, in descending reliability order, to the Q polarized channels whose reliability is in descending order.

In a possible design, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on a code distance and reliability, when the Q information bits are encoded by using the polar code, to obtain the second encoded bit sequence, the Q information bits are mapped to the first Q polarized channels of the P polarized channels that are sorted based on the code distance and the reliability, and Q is a positive integer less than or equal to P.

In a possible design, the Q information bits are mapped, in ascending code distance and reliability order, to the Q polarized channels whose code distances and reliability are in descending order, or the Q information bits are mapped, in descending code distance and reliability order, to the Q polarized channels whose code distances and reliability are in descending order.

In a possible design, the first communications device is a terminal and the second communications device is a network device, or the first communications device is a network device and the second communications device is a terminal, and before the receiving, by a second communications device, an encoded-bit combination sent by a first communications device in a target data transmission mode, the method further includes sending, by the second communications device, a first index to the first communications device, where the first index is used by the first communications device to determine the target data transmission mode, the first index is determined by the second communications device based on attribute information of the network device and/or quality of a channel between the first communications device and the second communications device, the attribute information includes one or more of a type of the network device, a distance between the first communications device and the second communications device, or a height from the network device to the ground, and the type includes a terrestrial base station or a non-terrestrial base station.

In a possible design, the target data transmission mode is determined by the first communications device based on attribute information of a network device and/or quality of a channel between the first communications device and the second communications device, the attribute information includes one or more of a type of the network device, a distance between the first communications device and the second communications device, or a height from the network device to the ground, and the type includes a terrestrial base station or a non-terrestrial base station.

In a possible design, a quantity that is of times of encoded-bit combination transmission and that corresponds to the non-terrestrial base station is less than or equal to a quantity that is of times of encoded-bit combination transmission and that corresponds to the terrestrial base station, and/or a quantity that is of encoded bit sequences included in the encoded-bit combination transmitted each time and that corresponds to the non-terrestrial base station is greater than or equal to a quantity that is of encoded bit sequences included in the encoded-bit combination transmitted each time and that corresponds to the terrestrial base station.

In a possible design, at least two of a plurality of encoded bit sequences included in a same encoded-bit combination have different code rates.

According to a third aspect, an embodiment of this application provides a communications device. The communications device is a first communications device. The first communications device may include a plurality of functional modules or units, configured to correspondingly perform the data transmission method provided in any one of the first aspect or the possible implementations of the first aspect.

According to a fourth aspect, an embodiment of this application provides another communications device. The communications device is a second communications device. The second communications device may include a plurality of functional modules or units, configured to correspondingly perform the data transmission method provided in any one of the second aspect or the possible implementations of the second aspect.

According to a fifth aspect, an embodiment of this application provides a communications device, configured to perform the data transmission method described in the first aspect. The communications device is a first communications device. The first communications device may include a memory, and a processor, a transmitter, and a receiver that are coupled to the memory. The transmitter is configured to support the first communications device in performing the step of sending information by the first communications device in the data transmission method provided in the first aspect. The receiver is configured to support the first communications device in performing the step of receiving information by the first communications device in the data transmission method provided in the first aspect. The processor is configured to support the first communications device in performing processing steps other than the steps of sending and receiving information by the first communications device in the data transmission method provided in the first aspect. It should be noted that the transmitter and the receiver in this embodiment of this application may be integrated, or may be coupled by using a coupler. The memory is configured to store code for implementing the data transmission method described in the first aspect. The processor is configured to execute a program code stored in the memory, that is, perform the method provided in any one of the first aspect or the possible implementations of the first aspect. The memory and the processor may be integrated, or may be coupled by using the coupler.

According to a sixth aspect, an embodiment of this application provides another communications device, configured to perform the data transmission method described in the second aspect. The communications device is a second communications device. The second communications device may include a memory, and a processor, a transmitter, and a receiver that are coupled to the memory. The transmitter is configured to support the second communications device in performing the step of sending information by the second communications device in the data transmission method provided in the second aspect. The receiver is configured to support the second communications device in performing the step of receiving information by the second communications device in the data transmission method provided in the second aspect. The processor is configured to support the second communications device in performing processing steps other than the steps of sending and receiving information by the second communications device in the data transmission method provided in the second aspect. It should be noted that the transmitter and the receiver in this embodiment of this application may be integrated, or may be coupled by using a coupler. The memory is configured to store code for implementing the data transmission method described in the second aspect. The processor is configured to execute a program code stored in the memory, that is, perform the method provided in any one of the second aspect or the possible implementations of the second aspect. The memory and the processor may be integrated, or may be coupled by using the coupler.

In this embodiment of this application, the communications device may also be referred to as a communications apparatus.

According to a seventh aspect, an embodiment of this application provides a communications system, including a first communications device and a second communications device. The first communications device may be the first communications device described in the third aspect or the fifth aspect, and the second communications device may be the second communications device described in the fourth aspect or the sixth aspect.

According to an eighth aspect, an embodiment of this application provides a computer-readable storage medium. The readable storage medium stores an instruction. When the instruction is run on a computer, the computer is enabled to perform the data transmission method described in the first aspect.

According to a ninth aspect, an embodiment of this application provides another computer-readable storage medium. The readable storage medium stores an instruction. When the instruction is run on a computer, the computer is enabled to perform the data transmission method described in the second aspect.

According to a tenth aspect, an embodiment of this application provides a computer program product that includes an instruction. When the computer program product runs on a computer, the computer is enabled to perform the data transmission method described in the first aspect.

According to an eleventh aspect, an embodiment of this application provides another computer program product that includes an instruction. When the computer program product runs on a computer, the computer is enabled to perform the data transmission method described in the second aspect.

According to a twelfth aspect, an embodiment of this application provides a communications chip. The communications chip may include a processor and one or more interfaces coupled to the processor. The processor may be configured to invoke, from a memory, a program for implementing the data transmission method provided in any one of the first aspect or the possible implementations of the first aspect, and execute an instruction included in the program. The interface may be configured to output a processing result of the processor.

According to a thirteenth aspect, an embodiment of this application provides a communications chip. The communications chip may include a processor and one or more interfaces coupled to the processor. The processor may be configured to invoke, from a memory, a program for implementing the data transmission method provided in any one of the second aspect or the possible implementations of the second aspect, and execute an instruction included in the program. The interface may be configured to output a processing result of the processor.

BRIEF DESCRIPTION OF THE DRAWINGS

To describe the technical solutions in embodiments of this application or in the background more clearly, the following briefly describes the accompanying drawings required for describing the embodiments of this application or the background.

DETAILED DESCRIPTION OF ILLUSTRATIVE EMBODIMENTS

The following describes the embodiments of this application with reference to the accompanying drawings in the embodiments of this application.

Figure 1:
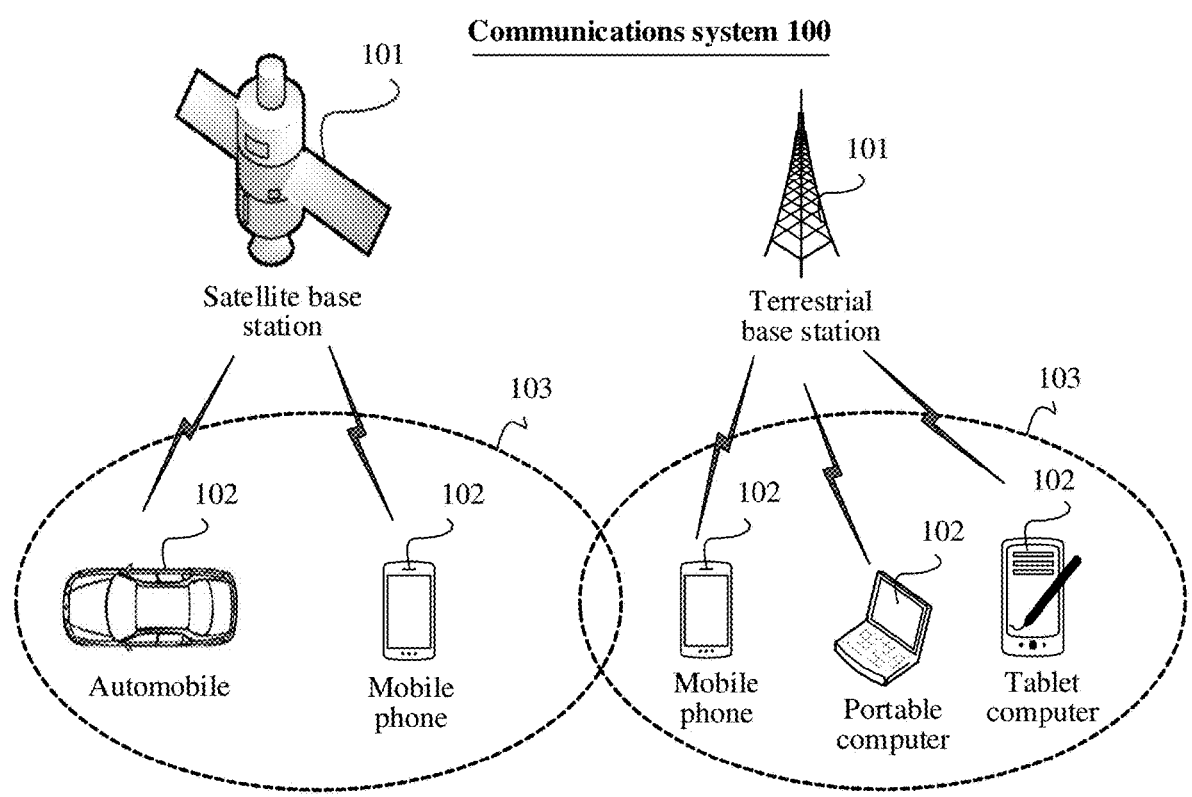
FIG. 1 is a schematic diagram of a communications system according to an embodiment of this application.

FIG. 1 is a schematic diagram of a communications system 100 according to an embodiment of this application. The communications system 100 may include at least one network device 101 (only one is shown) and one or more terminal devices 102 connected to the network device 101.

The network device 101 may perform wireless communication with the terminal device 102 by using one or more antennas. Each network device 101 is capable of providing communication coverage for a coverage area 103 corresponding to the network device 101. The coverage area 103 corresponding to the network device 101 may be divided into a plurality of sectors. One sector corresponds to a portion of the coverage area (not shown).

In this embodiment of this application, the network device 101 may be a terrestrial base station or a non-terrestrial base station. The non-terrestrial base station may have different types, including but not limited to a high-altitude base station (for example, a high-altitude platform station that can implement a function of the base station, such as a hot air balloon or an unmanned aerial vehicle), or a satellite (including a low-orbit satellite, a medium-orbit satellite, and a high-orbit satellite).

The network device 101 includes but is not limited to an evolved NodeB (eNodeB), a base station in a fifth generation (5G) communications system, a base station or a network device in a future communications system, and an access node in a wireless local area network system.

In this embodiment of this application, the terminal device 102 is a device having a wireless transceiver function, and may be deployed on land, including an indoor device or an outdoor device, a handheld device, a wearable device, or a vehicle-mounted device. The terminal device 102 may also be deployed on water (for example, on a ship) or in the air (for example, on an airplane or a balloon). The terminal device may be a mobile phone, a tablet computer (Pad), a portable computer, a computer having the wireless transceiver function, a virtual reality (VR) terminal device, an augmented reality (AR) terminal device, a wireless terminal in industrial control, a wireless terminal in self driving, a wireless terminal in telemedicine, a wireless terminal in a smart grid, a wireless terminal in transportation safety, a wireless terminal in a smart city, a smart automobile, a wireless terminal in a smart home, or the like. An application scenario is not limited in this embodiment of this application. Sometimes, the terminal device may also be referred to as user equipment (UE), a terminal, an access terminal, a UE unit, a UE station, a mobile device, a mobile node, a mobile station, a mobile terminal, a mobile client, a mobile unit, a remote station, a remote terminal device, a remote unit, a wireless unit, a wireless communications device, a user agent, a user apparatus, or the like.

It should be noted that the terms "system" and "network" in the embodiments of this application may be used interchangeably. "A plurality of" means two or more. In view of this, "a plurality of" may also be understood as "at least two" in the embodiments of this application. The term "and/or" describes an association relationship for describing associated objects and represents that three relationships may exist. For example, A and/or B may represent the following three cases: Only A exists, both A and B exist, and only B exists. In addition, unless otherwise specified, the character "/" generally indicates an "or" relationship between the associated objects.

Figure 2:
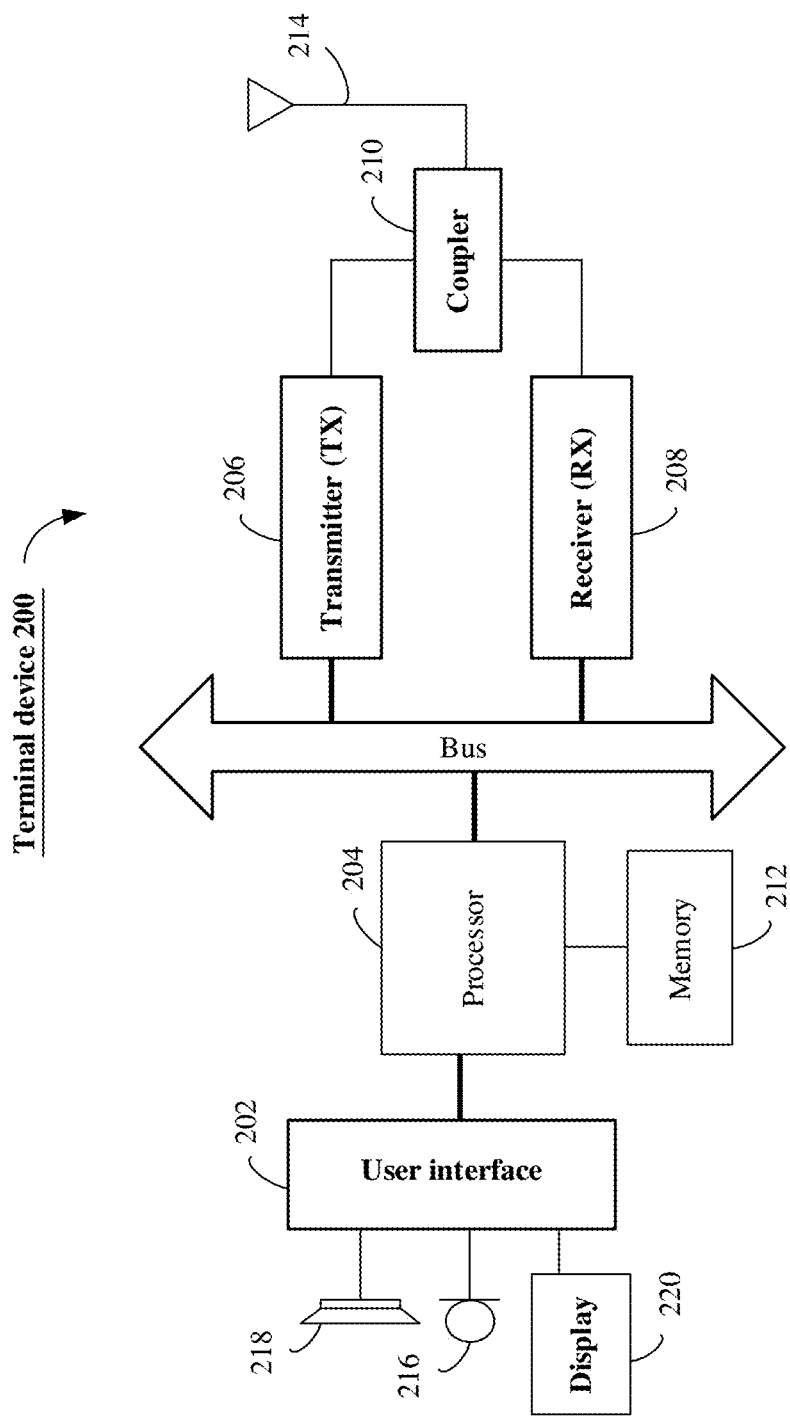
FIG. 2 is a schematic diagram of a hardware architecture of a terminal device according to an embodiment of this application.

FIG. 2 shows a terminal device 200 provided in an embodiment of this application. As shown in FIG. 2, the terminal device 200 may include an input and output module (including an audio input and output module 218, a key input module 216, a display 220, and the like), a user interface 202, one or more processors 204, a transmitter 206, a receiver 208, a coupler 210, an antenna 214, and a memory 212. These components may be connected by using a bus or in another manner. In FIG. 2, an example in which the components are connected by using the bus is used.

The antenna 214 may be configured to convert electromagnetic energy into an electromagnetic wave in free space, or convert an electromagnetic wave in free space into electromagnetic energy in a transmission line. The coupler 210 is configured to split a mobile communication signal received by the antenna 214 into a plurality of signals, and allocate the plurality of signals to a plurality of receivers 208.

The transmitter 206 may be configured to perform transmission processing on a signal output by the processor 204.

The receiver 208 may be configured to perform reception processing on the mobile communication signal received by the antenna 214.

In this embodiment of this application, the transmitter 206 and the receiver 208 may be considered as a wireless modem. The terminal device 200 may include one or more transmitters 206 and one or more receivers 208.

In addition to the transmitter 206 and the receiver 208 shown in FIG. 2, the terminal device 200 may further include another communications component, for example, a GPS module, a bluetooth module, or a wireless fidelity (Wi-Fi) module. Not limited to the foregoing wireless communication signal, the terminal device 200 may further support another wireless communication signal, for example, a satellite signal, or a short-wave signal. Not limited to wireless communication, the terminal device 200 may further support, by having a wired network interface (for example, a local area network (LAN) interface) 201, wired communication.

The input and output module may be configured to implement interaction between the terminal device 200 and a user/an external environment, and may mainly include the audio input and output module 218, the key input module 216, the display 220, and the like. Specifically, the input and output module may further include a camera, a touchscreen, a sensor, and the like. All the input and output modules communicate with the processor 204 by using the user interface 202.

The memory 212 may be coupled to the processor 204 by using the bus or an input and output port, or the memory 212 may be integrated with the processor 204. The memory 212 is configured to store various software programs and/or a plurality of groups of instructions. Specifically, the memory 212 may include a high-speed random access memory, and may also include a nonvolatile memory, for example, one or more magnetic disk storage devices, a flash memory device, or another nonvolatile solid-state storage device. The memory 212 may store an operating system (referred to as a system below), for example, an embedded operating system such as Android, iOS, Windows, or Linux. The memory 212 may further store a network communications program. The network communications program may be used to communicate with one or more additional devices, one or more terminal devices, and one or more network devices. The memory 212 may further store a user interface program. The user interface program may vividly display content of an application program by using a graphical user interface, and receive, by using an input control such as a menu, a dialog box, or a key, a control operation performed by the user on the application program.

In this embodiment of this application, the memory 212 may be configured to store a program for implementing, on a terminal device 200 side, the data transmission method provided in one or more embodiments of this application. For implementation of the data transmission method provided in the one or more embodiments of this application, refer to the following embodiments.

The processor 204 may be configured to read and execute a computer-readable instruction. Specifically, the processor 204 may be configured to invoke a program stored in the memory 212, for example, the program for implementing, on the terminal device 200 side, the data transmission method provided in the one or more embodiments of this application, and execute an instruction included in the program to implement the methods in the following embodiments. The processor 204 may support one or more of global system for mobile communications (GSM) (2G) communication, wideband code division multiple access (WCDMA) (3G) communication, long term evolution (LTE) (4G) communication, 5G communication, future evolved communication, or the like. Optionally, the processor 204 specifically drives or controls the transmitter 206 to send any message or data. Optionally, the processor 204 specifically drives or controls the receiver 208 to receive any message or data. Therefore, the processor 204 may be considered as a control center for performing sending or reception, and the transmitter 206 and the receiver 208 are specific executors of sending and reception operations.

It may be understood that the terminal device 200 may be the terminal device 102 in the communications system 100 shown in FIG. 1, and may be implemented as user equipment (UE), a terminal, an access terminal, a UE unit, a UE station, a mobile device, a mobile node, a mobile station, a mobile terminal, or the like.

It should be noted that the terminal device 200 shown in FIG. 2 is merely an implementation of the embodiments of this application, and in actual application, the terminal device 200 may further include more or fewer components. This is not limited herein.

Figure 3:
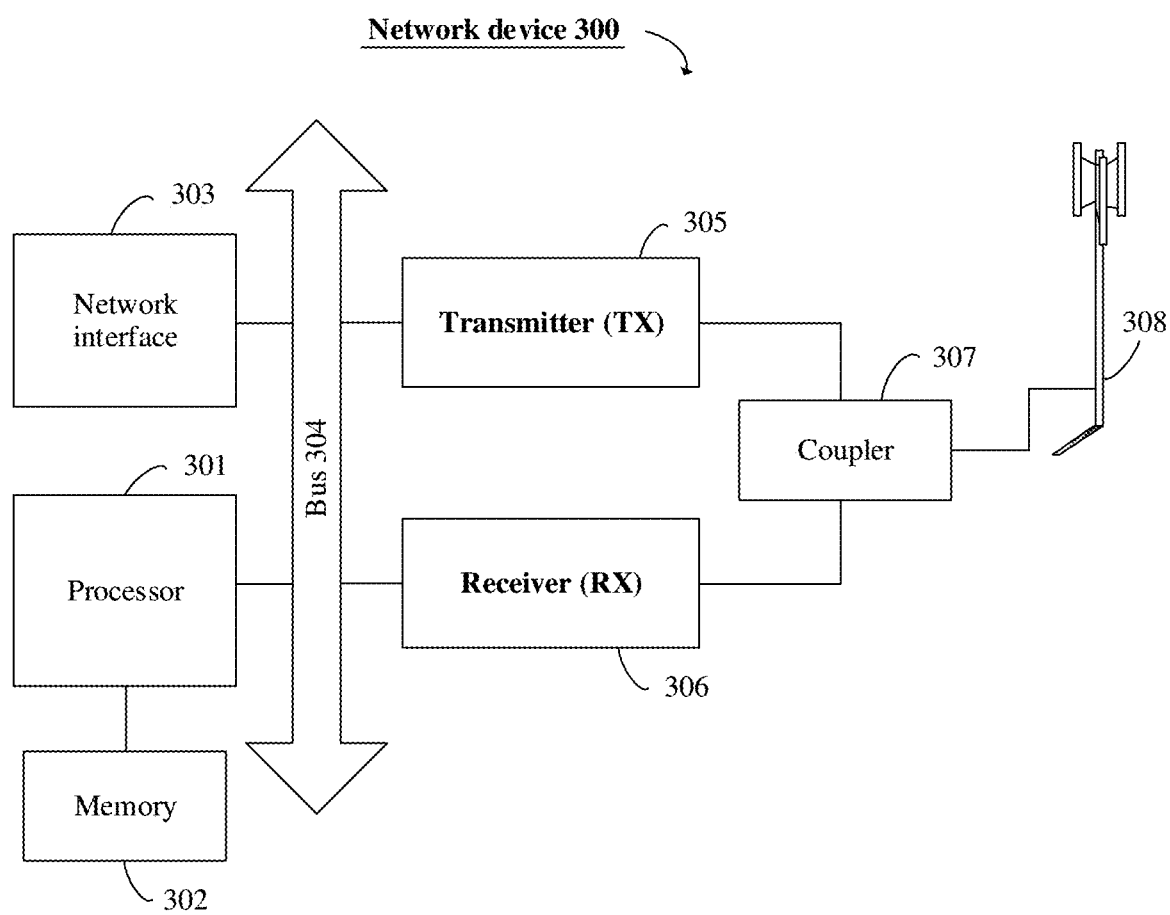
FIG. 3 is a schematic diagram of a hardware architecture of a network device according to an embodiment of this application.

FIG. 3 shows a network device 300 provided in an embodiment of this application. As shown in FIG. 3, the network device 300 may include one or more processors 301, a memory 302, a network interface 303, a transmitter 305, a receiver 306, a coupler 307, and an antenna 308. These components may be connected by using a bus 304 or in another manner. In FIG. 3, an example in which the components are connected by using the bus is used.

The network interface 303 may be used by the network device 300 for communicating with another communications device, for example, another network device. Specifically, the network interface 303 may be a wired interface.

The transmitter 305 may be configured to perform transmission processing, for example, signal modulation, on a signal that is output by the processor 301. The receiver 306 may be configured to perform reception processing, for example, signal demodulation, on a mobile communication signal received by the antenna 308. In some embodiments of this application, the transmitter 305 and the receiver 306 may be considered as a wireless modem. The network device 300 may include one or more transmitters 305 and one or more receivers 306. The antenna 308 may be configured to convert electromagnetic energy in a transmission line into an electromagnetic wave in free space, or convert an electromagnetic wave in free space into electromagnetic energy in a transmission line. The coupler 307 may be configured to split the mobile communication signal into a plurality of signals, and allocate the plurality of signals to the plurality of receivers 306.

The memory 302 may be coupled to the processor 301 by using the bus 304 or an input and output port, or the memory 302 may be integrated with the processor 301. The memory 302 is configured to store various software programs and/or a plurality of groups of instructions. Specifically, the memory 302 may include a high-speed random access memory, and may also include a nonvolatile memory, for example, one or more magnetic disk storage devices, a flash memory device, or another nonvolatile solid-state storage device. The memory 302 may store an operating system (referred to as a system below), for example, an embedded operating system such as uCOS, VxWorks, or RTLinux. The memory 302 may further store a network communications program. The network communications program may be used to communicate with one or more additional devices, one or more terminal devices, and one or more network devices.

In this embodiment of this application, the processor 301 may be configured to read and execute a computer-readable instruction. Specifically, the processor 301 may be configured to invoke a program stored in the memory 302, for example, a program for implementing, on a network device 300 side, the data transmission method provided in one or more embodiments of this application, and execute an instruction included in the program.

It may be understood that the network device 300 may be the network device 101 in the communications system 100 shown in FIG. 1, and may be implemented as a base station, a wireless transceiver, a basic service set (BSS), an extended service set (ESS), a gNB, or the like.

It should be noted that the network device 300 shown in FIG. 3 is merely an implementation of the embodiments of this application, and in actual application, the network device 300 may further include more or fewer components. This is not limited herein.

An inventive concept of this application is described first. Satellite communication is typically characterized by a long transmission distance and a large latency. If an HARQ mechanism in LTE continues to be used, a latency is greatly increased, and communication efficiency is severely affected. Currently, some satellite communications systems do not directly support the HARQ mechanism, to reduce the latency. However, as the satellite communication and terrestrial communication are integrated, and a user has an increasingly high reliability requirement for communication data, a new transmission mechanism and a corresponding channel coding scheme need to be considered. A polar code is introduced into a 5G standard as a new code. The polar code has high reliability and will inevitably become one of preferred channel coding schemes in future satellite communication. For a terrestrial base station, the polar code is used on a control channel and does not relate to an HARQ. A corresponding encoding technology is also available for a conventional HARQ manner. However, for the satellite communication, no related polar code-based encoding scheme is currently available to balance latency and reliability. In this application, to avoid the large latency in the satellite communication, an existing polar code-based encoding scheme is improved to increase satellite communication efficiency. In this application, different polar encoded versions are combined and sent based on a base station type or even a distance between a satellite base station and the ground. Polar encoded versions may be properly designed and combined based on channel quality in the satellite communication, the base station type, and the like.

The polar code is a linear block code. A generator matrix of the polar code is $F_N$, and a polar code-based encoding process is $$x_1^N = u_1^N F_N \cdot u_1^N = (u_1, u_2, \ldots, u_N)$$

is a binary row vector, and a length is N (namely, a code length). $F_N$ is an N×N matrix, and $F_N = F_2^{\otimes (\log_2(N))}$, where $$F_2 = \begin{bmatrix} 1 & 0 \\ 1 & 1 \end{bmatrix},$$

and $F_2^{\otimes (\log_2(N))}$ is defined as a Kronecker product of $\log_2 N$ matrices $F_2$.

The foregoing related addition and multiplication operations are all addition and multiplication operations in a binary Galois Field. In the polar code-based encoding process, some bits in $u_1^N$ are used to carry information and are referred to as information bits, and a set of indexes of these bits is denoted by I, and other bits are set to fixed values that are agreed on by a transmit end and a receive end in advance, and are referred to as fixed bits, and a set of indexes of these bits is denoted by a complementary set $I^c$ of I.

In this application, an encoded version may be understood as an encoded bit sequence that is obtained by encoding all or some of K (K is a positive integer) information bits by using the polar code. An encoded-bit combination may be understood as a set of one or more encoded bit sequences transmitted at a time. For example, K is 16, and the K information bits are u1 to u16. A first encoded bit sequence may be a bit sequence obtained by encoding the 16 information bits u1 to u16 by using the polar code, a second encoded bit sequence may be obtained by encoding eight information bits u9 to u16 by using the polar code, and a third encoded bit sequence may be obtained by encoding four information bits u7, u8, u15 and u16 by using the polar code. A transmit end device may combine the three encoded bit sequences and send them to a receive end device through one transmission. In this case, the first encoded bit sequence, the second encoded bit sequence, and the third encoded bit sequence are an encoded-bit combination. Alternatively, a transmit end device may send the first encoded bit sequence to a receive end device in the first transmission process, and combine the second encoded bit sequence and the third encoded bit sequence and send them to the receive end device in the second transmission process. Certainly, a transmit end device may alternatively send the first encoded bit sequence to a receive end device in the first transmission process, send the second encoded bit sequence to the receive end device in the second transmission process, and send the third encoded bit sequence to the receive end device in the third transmission process. The receive end device may decode the received three encoded bit sequences, to restore the 16 information bits u1 to u16.

It should be noted that when information bits in the K information bits are encoded, code lengths used in different times of encoding may be the same or may be different. Code rates used in the different times of encoding may be the same or may be different. This is not limited in this application. For example, the first encoded bit sequence is the bit sequence obtained by encoding the 16 information bits u1 to u16 by using the polar code, and a code rate in use is ½. In other words, a quantity of information bits is 16, and a code length N is 32. The second encoded bit sequence is obtained by encoding the eight information bits u9 to u16 by using the polar code, and a code rate in use is ¼. In other words, a quantity of information bits is 8, and a code length N is 32. The third encoded bit sequence is obtained by encoding the four information bits u7, u8, u15, and u16 by using the polar code, and a code rate in use is ⅛. In other words, a quantity of information bits is 4, and a code length N is 32. In this example, description is provided by using an example in which the code lengths used in the different times of encoding are the same and the code rates used in the different times of encoding are different.

For another example, the first encoded bit sequence is the bit sequence obtained by encoding the 16 information bits u1 to u16 by using the polar code, and a code rate in use is ½. In other words, a quantity of information bits is 16, and a code length is 32. The second encoded bit sequence is obtained by encoding the eight information bits u9 to u16 by using the polar code, and a code rate in use is ½. In other words, a quantity of information bits is 8, and a code length is 16. The third encoded bit sequence is obtained by encoding the four information bits u7, u8, u15, and u16 by using the polar code, and a code rate in use is ½. In other words, a quantity of information bits is 4, and a code length is 8. In this example, description is provided by using an example in which the code lengths used in the different times of encoding are different and the code rates used in the different times of encoding are the same.

For another example, the first encoded bit sequence is the bit sequence obtained by encoding the 16 information bits u1 to u16 by using the polar code, and a code rate in use is ½. In other words, a quantity of information bits is 16, and a code length is 32. The second encoded bit sequence is obtained by encoding the eight information bits u9 to u16 by using the polar code, and a code rate in use is ⅙. In other words, a quantity of information bits is 8, and a code length is 48. The third encoded bit sequence is obtained by encoding the four information bits u7, u8, u15, and u16 by using the polar code, and a code rate in use is ¹⁄₁₈. In other words, a quantity of information bits is 4, and a code length is 72. In this example, description is provided by using an example in which the code lengths used in the different times of encoding are different and the code rates used in the different times of encoding are also different.

In other words, when the code lengths used in the different times of encoding are the same, the code rates used in the different times of encoding may be different. When the code lengths used in the different times of encoding are different, the code rates used in the different times of encoding may be the same or may be different.

It may be understood that when the code lengths used in the different times of encoding are equal, the code rate may also represent a relationship between quantities of information bits selected in the different times of encoding. For example, the first-time encoding is to encode the 16 information bits u1 to u16 by using the polar code, the code length is N, and the code rate in use is R. The code length used in the second-time encoding is also N, and the code rate is R/2. Therefore, it can be learned that the quantity of information bits in the second-time encoding is 8. The code length used in the third-time encoding is also N, and the code rate is R/4. Therefore, it can be learned that the quantity of information bits in the third-time encoding is 4.

It may be understood that when the code rates used in the different times of encoding are the same, the code length may also represent the relationship between the quantities of information bits selected in the different times of encoding. For example, the first-time encoding is to encode the 16 information bits u1 to u16 by using the polar code, the code length is N, and the code rate in use is R. The code rate used in the second-time encoding is also R, and the code length is N/2. Therefore, it can be learned that the quantity of information bits in the second-time encoding is 8. The code rate used in the third-time encoding is also R, and the code length is N/4. Therefore, it can be learned that the quantity of information bits in the third-time encoding is 4.

It should be noted that when the information bits in the K information bits are encoded, information bits used in the different times of encoding may be the same or may be different. When the information bits used in the different times of encoding are different, for how to select an information bit used in each encoding, this application provides the following several information bit selection methods.

Manner 1: An information bit to be encoded each time is selected based on reliability of a polarized channel.

Figure 4:
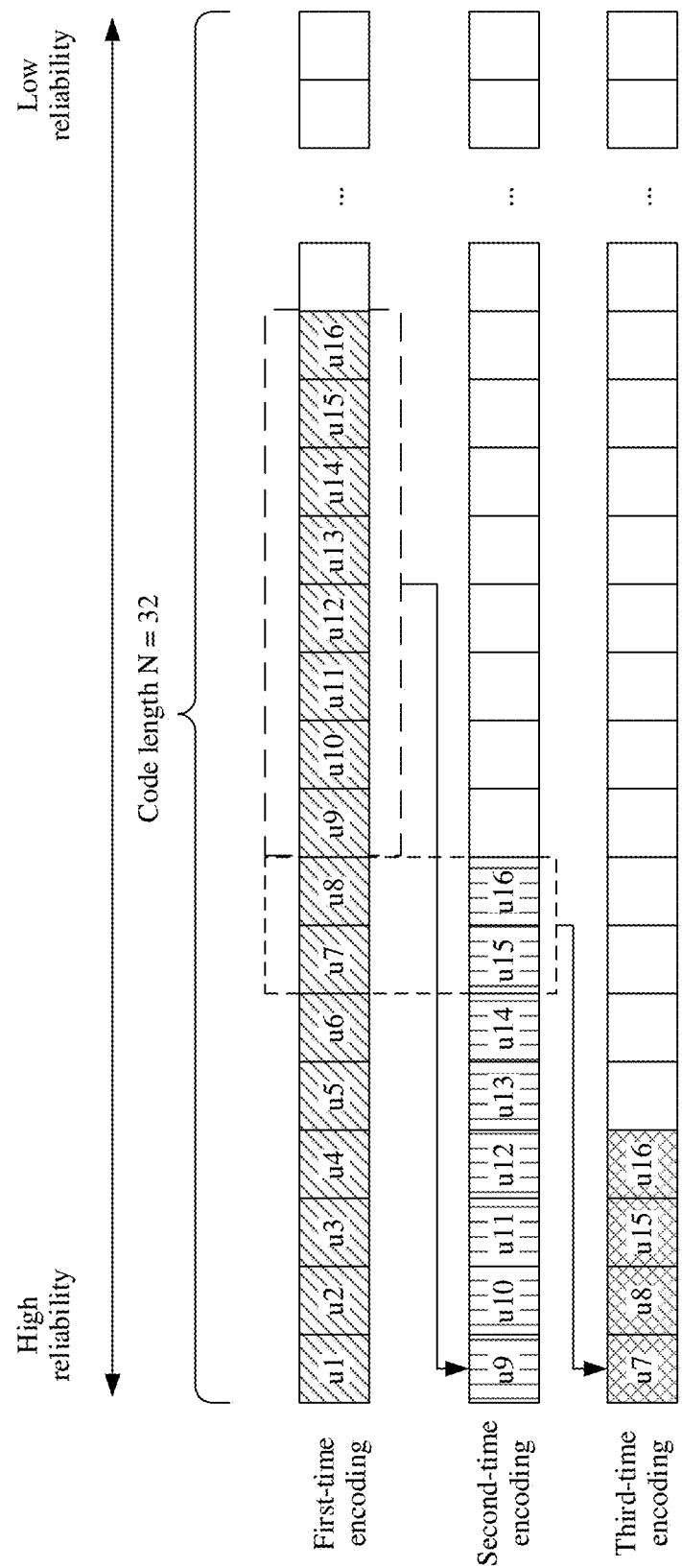
FIG. 4 is a schematic diagram of mapping an information bit to a polarized channel according to an embodiment of this application.

The polar code includes N polarized channels whose reliability is polarized. To be specific, reliability of some channels tends to be 1, and reliability of other channels tends to be 0. During encoding, an information bit needs to be placed at a location with relatively high reliability, and a fixed bit is placed at a remaining location. As shown in FIG. 4, information bits are 16 bits u1 to u16, and a code length is 32. To be specific, there are 32 polarized channels, and the polarized channels are arranged from left to right in descending reliability order. To improve transmission reliability, a transmit end sequentially places the 16 information bits u1 to u16 on the first 16 polarized channels with high reliability in the 32 polarized channels. If an encoded-bit combination sent by the transmit end to a receive end includes a plurality of encoded bit sequences, an information bit used in each encoding may be selected based on reliability of polarized channels.

As shown in FIG. 4, it is assumed that, for an encoded-bit combination transmitted at a time, a code rate is $$\frac{1}{2} + \frac{1}{4} + \frac{1}{8},$$

a code length N is 32, a quantity K of information bits is 16, and the information bits are u1 to u16.

The polarized channels are arranged from left to right in descending reliability order, and the first 16 polarized channels are used for the information bits. The reliability of the polarized channel also reflects an error probability of a corresponding information bit during decoding, that is, lower reliability of the polarized channel indicates a higher error probability of the corresponding information bit during decoding. Therefore, in this application, an encoding scheme is designed by using such a feature of the polar code. Details are shown in FIG. 4. For each encoding, an information bit with relatively low reliability during previous transmission or encoding is selected, and the information bit is placed at a location with relatively high reliability for encoding. For example, as shown in FIG. 4, information bits that are prone to an error in the first-time encoding are u9 to u16. In the second-time encoding, u9 to u16 are placed on eight polarized channels with highest reliability for encoding. After two times of decoding, information bits with relatively low reliability are u7, u8, u15, and u16. In the third-time encoding, these information bits are placed on four polarized channels with highest reliability for encoding. After three times of decoding, information bits with relatively low reliability are u5, u6, u13, and u14. In the fourth-time encoding, these information bits are placed on four polarized channels with highest reliability for encoding. Encoding in this manner can ensure relatively high reliability for all information bits, thereby improving transmission reliability.

In the encoding method shown in FIG. 4, it is assumed that a hard substitution method is used for decoding. That is, an information bit decoded each time is independent, and reliability of the information bit decoded each time is related only to reliability of a corresponding polarized channel in current encoding. If results of a plurality of times of decoding are all considered, reliability of information bits may be updated in a combination manner. A method in which decoding and encoding are performed in the combination manner is described with reference to FIG. 5.

Figure 5:
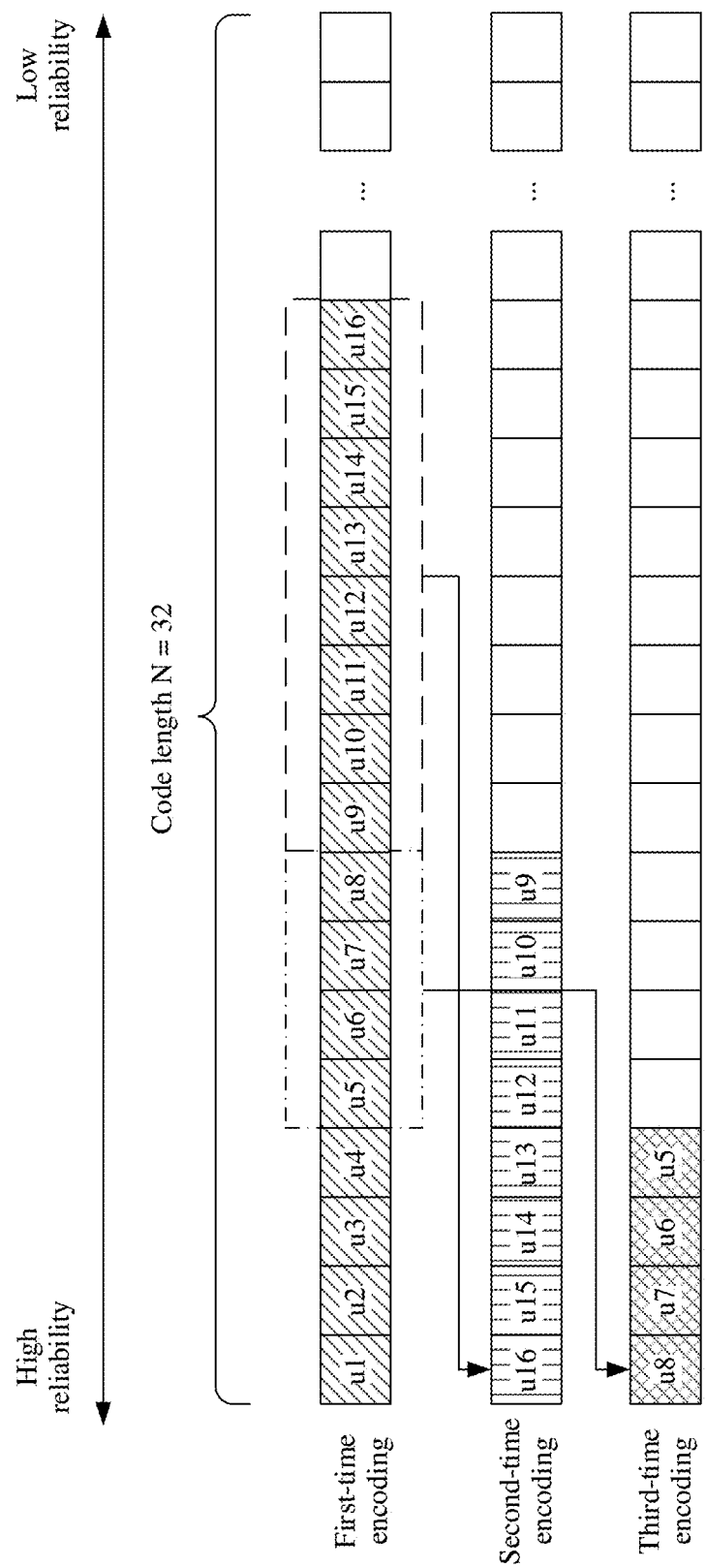
FIG. 5 is another schematic diagram of mapping an information bit to a polarized channel according to an embodiment of this application.

As shown in FIG. 5, it is assumed that, for an encoded-bit combination transmitted at a time, a code rate is $$\frac{1}{2} + \frac{1}{4} + \frac{1}{8},$$

a code length N is 32, a quantity K of information bits is 16, and the information bits are u1 to u16.

32 polarized channels are arranged in descending reliability order. It is assumed that reliability of 16 polarized channels with highest reliability is 16, 15, 14, 13, 12, . . . , and 1 respectively. In the first-time encoding, the 16 information bits are placed on the 16 polarized channels with highest reliability. In the second-time encoding, information bits u9 to u16 with relatively low reliability are selected, and are placed, in ascending order of reliability of the information bits, on eight polarized channels with highest reliability in the current encoding. The second-time decoding result and a previous-time decoding result are combined, that is, the reliability of u9 to u16 in the second-time decoding is updated to 8+9, 7+10, 6+11, 5+12, 4+13, 3+14, 2+15, and 1+16 respectively. In the third-time encoding, information bits u5 to u8 with relatively low reliability are selected, and are placed, in ascending order of reliability of the information bits, on four polarized channels with highest reliability in the current encoding. The reliability of u5 to u8 is updated to 12+13, 11+14, 10+15, and 9+16 respectively.

Manner 2: An information bit to be encoded each time is selected based on reliability and a code distance of a polarized channel.

Figure 6:
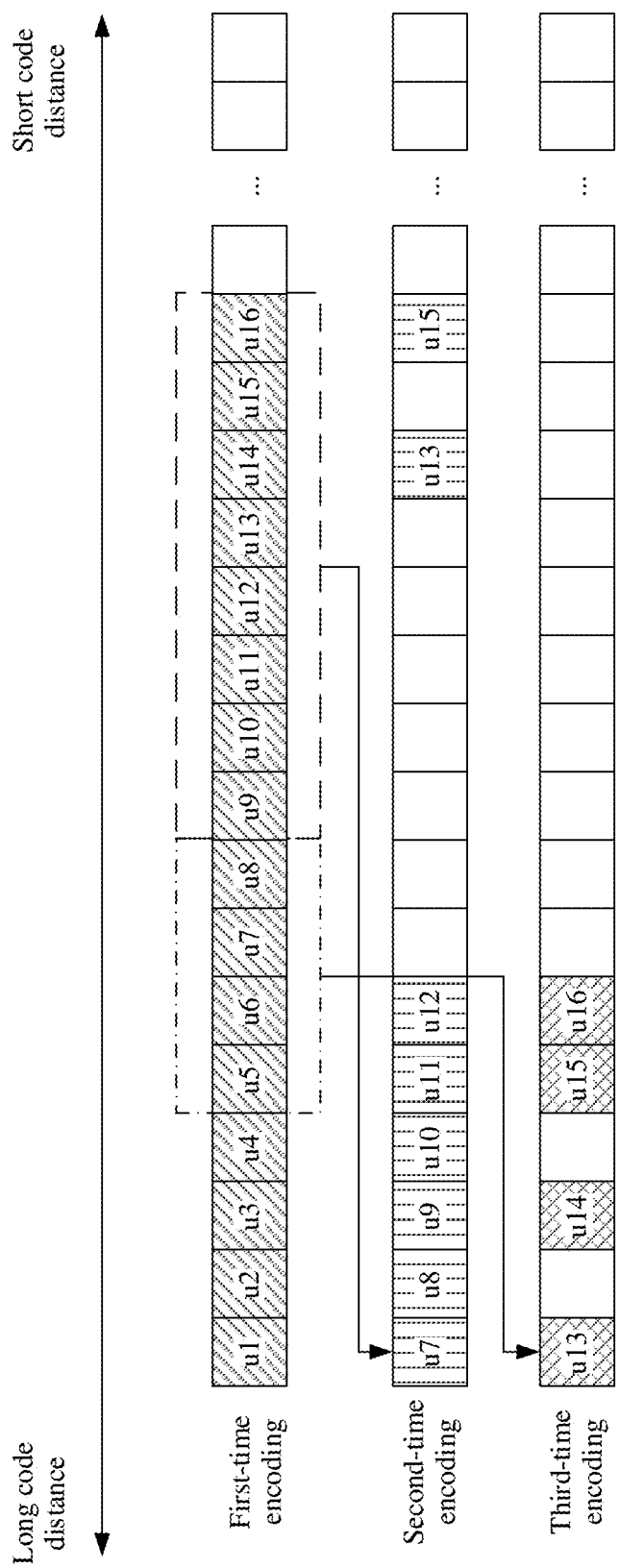
FIG. 6 is another schematic diagram of mapping an information bit to a polarized channel according to an embodiment of this application.

When the polar code is used to decode an information bit, an error probability is related to the reliability of the polarized channel, and the code distance also affects decoding performance to some extent, which is the same as that when another code is used. Therefore, an information bit selected in each encoding may also be determined based on both the code distance and the reliability of the polarized channel. A code distance of the polar code is not unique. Referring to FIG. 6, it is assumed that 16 channels with a longest code distance are selected from 32 polarized channels to carry information bits u1 to u16 with corresponding code distances of 32, 16, 16, 16, 16, 16, 16, 8, 8, 8, 8, 8, 8, 8, 8, and 8 respectively, and with corresponding reliability of 32, 25, 26, 24, 30, 31, 6, 11, 13, 21, 14, 22, 27, 29, 16, and 28 respectively.

It is assumed that a code rate of an encoded-bit combination transmitted at a time is $$\frac{1}{2} + \frac{1}{4} + \frac{1}{8}.$$

In the second-time encoding, eight information bits with a shortest code distance are selected. Because code distances of 10 information bits u7 to u16 are the same, eight bits with lowest reliability, namely, u7, u8, u9, u10, u11, u12, u13, and u15, are selected and placed on eight polarized channel with a longest code distance and highest reliability, with corresponding code distances updated to 32, 16, 16, 16, 16, 16, 16, 8, and 8 respectively and with corresponding reliability updated to 32, 25, 26, 24, 30, 31, 29, and 28 respectively. In other words, the code distances of u1 to u16 are 32, 16, 16, 16, 16, 16, 32, 16, 16, 16, 16, 16, 8, 8, 8, and 8 respectively, and the reliability of u1 to u16 are 32, 25, 26, 24, 30, 31, 32, 25, 26, 24, 30, 31, 29, 29, 28, and 28 respectively. In the third-time encoding, four information bits u13 to u16 with a shortest code distance are selected, and are placed at locations with a longest code distance and highest reliability, with corresponding code distances updated to 32, 16, 16, and 16 respectively, and with corresponding reliability of polarized channels of 32, 26, 30, and 31 respectively.

Certainly, information bits used in each encoding may be completely or partially the same. This is not limited in this application.

It should be noted that the reliability of the polarized channel in this application may not be real reliability, but is a value obtained after the real reliability is normalized. The value may represent a relative value of the reliability.

The foregoing several encoding schemes may be performed in a same manner for various code rate combinations, and are also applicable to other embodiments.

It should be noted that, if information bits used in a plurality of times of encoding are the same, code rates used in the different times of encoding may be the same or may be different. Moreover, if the information bits used in the plurality of times of encoding are the same, code lengths used in the different times of encoding may be the same or may be different.

When the information bits (for example, K information bits) used in the different times of encoding are the same, relative locations of the information bits in the different times of encoding may be determined in an interleaving manner and mapped to K polarized channels with high reliability and/or a long code distance.

In the plurality of times of encoding, information bits used in at least two times of encoding may be the same, or information bits used in at least two times of encoding may be different. For example, the first-time encoding is to encode the 16 information bits u1 to u16 by using the polar code, the code length is N, and the code rate is R. The second-time encoding is also to encode the 16 information bits u1 to u16 by using the polar code, the code length in use is N/2, and the code rate is 2R. The third-time encoding is to encode the eight information bits u9 to u16 by using the polar code, the code length in use is N, and the code rate is also R/2.

Figure 7:
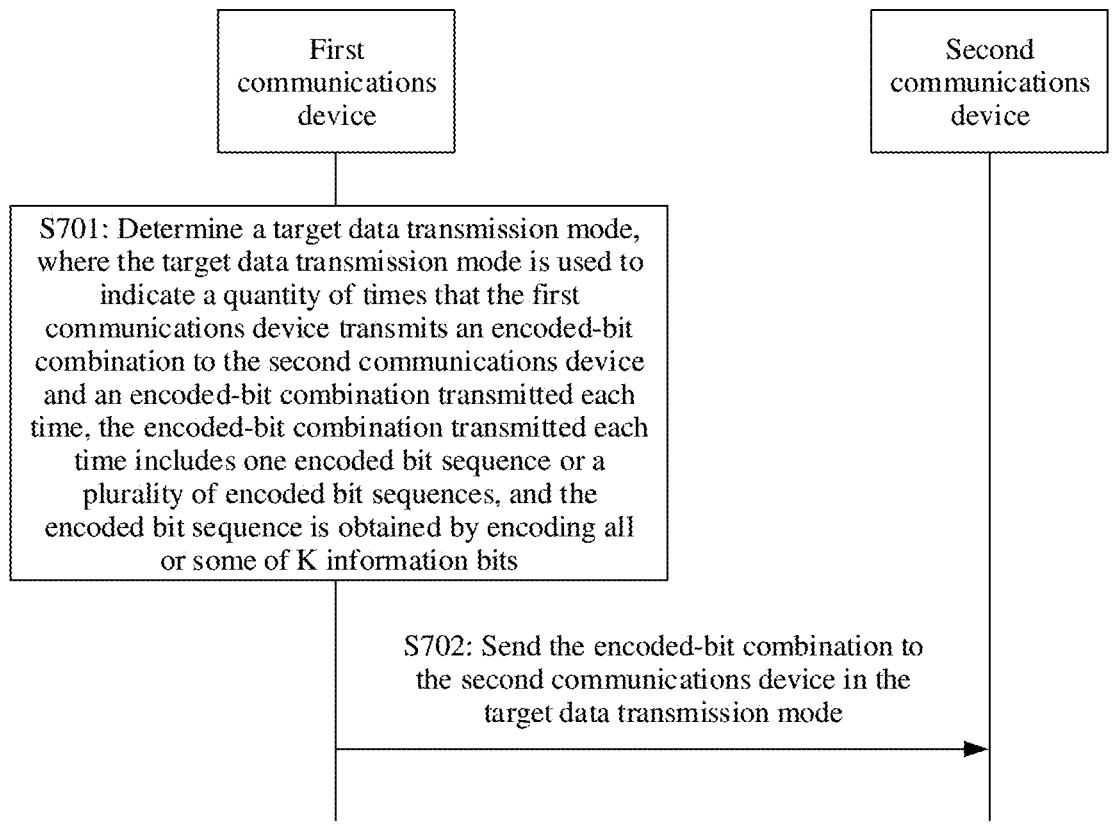
FIG. 7 is a schematic flowchart of a data transmission method according to an embodiment of this application.

Based on the embodiments respectively corresponding to the communications system 100, the terminal device 200, and the network device 300, an embodiment of this application provides a data transmission method. Referring to FIG. 7, the data transmission method includes but is not limited to the following steps.

S701: A first communications device determines a target data transmission mode, where the target data transmission mode is used to indicate a quantity of times that the first communications device transmits an encoded-bit combination to a second communications device and an encoded-bit combination transmitted each time, the encoded-bit combination transmitted each time includes one encoded bit sequence or a plurality of encoded bit sequences, the encoded bit sequence is obtained by encoding all or some of K information bits, and K is a positive integer.

S702: The first communications device sends the encoded-bit combination to the second communications device in the target data transmission mode, and the second communications device receives the encoded-bit combination sent by the first communications device in the target data transmission mode.

In this embodiment of this application, the first communications device is a terminal device and the second communications device is a network device (for example, a base station), or the first communications device is a network device and the second communications device is a terminal device. The following embodiment is described by using an example in which the first communications device is the terminal device and the second communications device is the network device.

Figure 8:
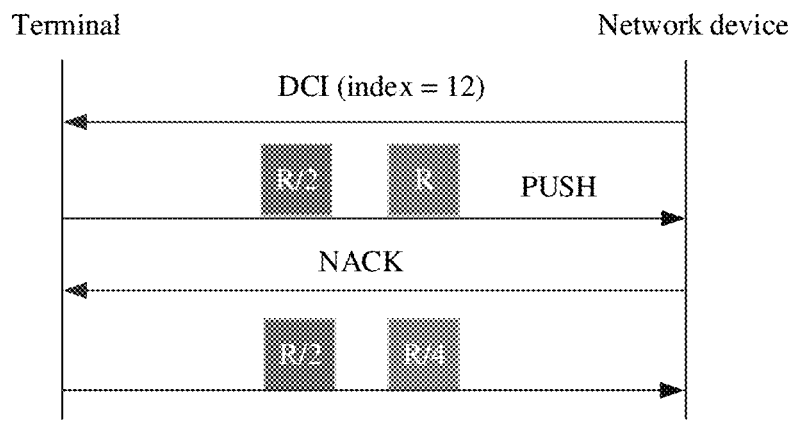
FIG. 8 is a schematic flowchart of a data transmission method according to an embodiment of this application.

In an implementation, the network device may indicate the terminal device to select a data transmission mode. In this case, the network device and the terminal device may preconfigure a mapping table between an index and a data transmission mode. The data transmission mode may reflect an encoded-bit combination transmitted each time and a maximum quantity of transmission times. Description is provided by using an example in which code lengths used in different times of encoding are equal (that is, a code rate may represent a relationship between quantities of information bits selected in the different times of encoding). For example, the mapping table between an index and a data transmission mode may be but is not limited to Table 1. In a data transmission mode represented by an index 11, a maximum quantity of transmission times is 2, an encoded bit sequence whose code rate is R and an encoded bit sequence whose rate is R/3 are sent during the first transmission, and if the encoded bit sequences are not correctly decoded, an encoded bit sequence whose code rate is R/5 is sent during the second transmission. In a data transmission mode represented by an index 12, a maximum quantity of transmission times is 2, an encoded bit sequence whose code rate is R and an encoded bit sequence whose code rate is R/2 are sent during the first transmission, and if the encoded bit sequences are not correctly decoded, an encoded bit sequence whose code rate is R/2 and an encoded bit sequence whose code rate is R/4 are sent during the second transmission. FIG. 8 shows the data transmission mode corresponding to the index 12.

TABLE 1

| Index | Data transmission mode |
|---|---|
| 0 | R |
| 1 | R + R/2 |
| 2 | R + R/3 |
| 3 | R + R/4 |
| 4 | R + R/5 |
| 5 | R + R/2 + R/4 |
| 6 | R + R/2 + R/5 |
| 7 | R + R/3 + R/4 |
| 8 | R + R/3 + R/5 |
| 9 | R + R/2 + R/3 + R/4 |
| 10 | R + R/2 + R/3 + R/5 |
| 11 | R + R/3, R/5 |
| 12 | R + R/2, R/2 + R/4 |
| ... | ... |

It can be learned from Table 1 that there may be one or more times of transmission and one or more encoded bit sequences may be transmitted at a time.

In specific implementation, the network device sends a first index to the terminal device, and the terminal device receives the first index sent by the network device, and searches Table 1 for a data transmission mode corresponding to the first index. If the first index sent by the network device to the terminal device is 12, the terminal device can learn, by querying Table 1, about the corresponding data transmission mode in which the maximum quantity of transmission times is 2, an encoded-bit combination transmitted at the first time includes the encoded bit sequence whose code rate is R and the encoded bit sequence whose code rate is R/2, and if an error occurs when the network device performs decoding, an encoded-bit combination transmitted at the second time includes the encoded bit sequence whose code rate is R/2 and the encoded bit sequence whose code rate is R/4. If information bits that need to be transmitted by the terminal are 16 information bits u1 to u16, the terminal device encodes the 16 information bits u1 to u16 by using a polar code, to obtain an encoded bit sequence whose code rate is R, selects eight information bits from the 16 information bits and encodes the selected information bits by using the polar code, to obtain an encoded bit sequence whose code rate is R/2, and combines the two encoded bit sequences and sends them to the network device. If an error occurs when the network device performs decoding, the network device sends an NACK message to the terminal. After receiving the NACK message, the terminal device selects eight information bits from the 16 information bits and encodes the selected information bits by using the polar code, to obtain an encoded bit sequence whose code rate is R/2, selects four information bits from the 16 information bits and encodes the selected information bits by using the polar code, to obtain an encoded bit sequence whose code rate is R/4, and combines the two encoded bit sequences and sends them to the network device. For details, refer to FIG. 5. The terminal device may select the eight information bits and the four information bits from the 16 information bits based on reliability of a polarized channel or based on reliability and a code distance of a polarized channel. For details, refer to related descriptions in the foregoing embodiment. Details are not described herein again.

It should be noted that, if a maximum quantity of transmission times corresponding to a data transmission mode is one, after receiving an encoded bit sequence sent by the terminal, the network device does not need to send the NACK message to the terminal.

The network device may send the first index to the terminal in a broadcast system message or other signaling. For example, before accessing a network, the terminal needs to listen to the system message broadcast by the network device and obtain the first index from the received broadcast system message through parsing. The network device may send an index to the terminal by using downlink control information (DCI).

The network device may determine the data transmission mode based on a distance between the terminal and the network device, a height from the network device to the ground, a type of the network device (for example, a terrestrial base station or a non-terrestrial base station), or quality of a communication link between the terminal and the network device. For example, if the distance between the terminal and the network device is relatively short, the network device may select a data transmission mode in which a quantity of transmission times is relatively large and a quantity of encoded bit sequences carried in a single transmission is relatively small. If the distance between the terminal and the network device is relatively long, the network device may select a data transmission mode in which a quantity of transmission times is relatively small and a quantity of encoded bit sequences carried in a single transmission is relatively large. Alternatively, if a distance between the network device and the ground is relatively short, the network device may select a data transmission mode in which a quantity of transmission times is relatively large and a quantity of encoded bit sequences carried in a single transmission is relatively small. If a distance between the network device and the ground is relatively long, the network device may select a data transmission mode in which a quantity of transmission times is relatively small and a quantity of encoded bit sequences carried in a single transmission is relatively large. Alternatively, if the network device is the terrestrial base station, to improve communication reliability, the network device may select a data transmission mode in which a quantity of transmission times is relatively large and a quantity of encoded bit sequences carried in a single transmission is relatively small. If the network device is the non-terrestrial base station, for example, a satellite base station, the network device may select a data transmission mode in which a quantity of transmission times is relatively small and a quantity of encoded bit sequences carried in a single transmission is relatively large. Alternatively, if a status (or quality) of a channel between the terminal and the network device is relatively good, the network device may select a data transmission mode in which a quantity of transmission times is relatively large and a quantity of encoded bit sequences carried in a single transmission is relatively small. If a status of a channel between the terminal and the network device is relatively poor, the network device may select a data transmission mode in which a quantity of transmission times is relatively small and a quantity of encoded bit sequences carried in a single transmission is relatively large.

Alternatively, in actual application, to reduce signaling overheads, the terminal may determine a data transmission mode to be selected. That is, the network device does not need to send an index to the terminal. When accessing a network, the terminal needs to obtain a type of the network device. If the network device is a satellite base station, the terminal further needs to obtain height information of the satellite base station to estimate a latency. Therefore, the terminal may determine a corresponding data transmission mode based on a satellite height, a channel status, a current code rate of the terminal, and the like. In this scheme, a transmission process of satellite communication is further simplified. In the embodiment in which the network device determines the target data transmission mode and further sends the index to the terminal, flexibility is relatively high. The terminal may determine the data transmission mode based on a distance between the terminal and the network device, the type of the network device (for example, a terrestrial base station or a non-terrestrial base station), or quality of a communication link between the terminal and the network device. If the distance between the terminal and the network device is relatively short, the terminal may select a data transmission mode in which a quantity of transmission times is relatively large and a quantity of encoded bit sequences carried in a single transmission is relatively small. If the distance between the terminal and the network device is relatively long, the terminal may select a data transmission mode in which a quantity of transmission times is relatively small and a quantity of encoded bit sequences carried in a single transmission is relatively large. Alternatively, if a distance between the network device and the ground is relatively short, the terminal may select a data transmission mode in which a quantity of transmission times is relatively large and a quantity of encoded bit sequences carried in a single transmission is relatively small. If a distance between the network device and the ground is relatively long, the terminal may select a data transmission mode in which a quantity of transmission times is relatively small and a quantity of encoded bit sequences carried in a single transmission is relatively large. Alternatively, if the network device is the terrestrial base station, to improve communication reliability, the terminal may select a data transmission mode in which a quantity of transmission times is relatively large and a quantity of encoded bit sequences carried in a single transmission is relatively small. If the network device is the non-terrestrial base station, for example, the satellite base station, the terminal may select a data transmission mode in which a quantity of transmission times is relatively small and a quantity of encoded bit sequences carried in a single transmission is relatively large. Alternatively, if a status (or quality) of a channel between the terminal and the network device is relatively good, the terminal may select a data transmission mode in which a quantity of transmission times is relatively large and a quantity of encoded bit sequences carried in a single transmission is relatively small. If a status of a channel between the terminal and the network device is relatively poor, the terminal may select a data transmission mode in which a quantity of transmission times is relatively small and a quantity of encoded bit sequences carried in a single transmission is relatively large.

Different from the terrestrial base station, the satellite base station has different heights. The satellite base station may be further classified into a low-orbit satellite, a medium-orbit satellite, and a high-orbit satellite. For example, the high-orbit satellite may be more than 3500 km away from the ground, and the low-orbit satellite may be less than 600 km away from the ground. Maximum distances between some high-altitude platform stations (HAPS) (such as a hot air balloon and an unmanned aerial vehicle) and a user are even less than a distance between the user and a terrestrial base station. Therefore, there is a relatively large difference between communication latencies between non-terrestrial base stations of different heights and the terminal. For an HAPS-type base station or the low-orbit satellite base station, a same data transmission mode as that of the terrestrial base station may be used, or a quantity of transmission times may be increased appropriately. For the high-orbit satellite, a quantity of transmission times may be reduced or only one transmission may be performed. In this way, a latency and reliability can be comprehensively considered, and the base station can flexibly select one or more times of transmission, to ensure communication efficiency of different users.

Table 1 may be further divided into a plurality of tables based on different base station types. Different base station/network device types correspond to different data transmission lists. The terminal determines a type of the base station based on an index sent by the base station or based on other information sent by the base station. The type of the base station may be the terrestrial base station, a high-altitude platform station, the low-orbit satellite, the medium-orbit satellite, or the high-orbit satellite.

As shown in the following Table 2 to Table 5, each base station type corresponds to at least one data transmission mode that is indicated by different indexes. In addition, the base station types are not limited to the four types in the tables, and the high-orbit satellite, the medium-orbit satellite, and the low-orbit satellite may be further divided. One type of satellite corresponds to a plurality of types of data transmission. For a same satellite, distances between different coverage areas corresponding to the satellite and the satellite are different, and therefore, different transmission modes may be used. In addition, different encoding parameters such as a code rate during encoding by the terminal may also correspond to different transmission modes. This improves flexibility of satellite data transmission.

A specific transmission mode is not limited to the types in the tables. For example, in a plurality of times of transmission of the low-orbit satellite, one encoded bit sequence may be transmitted one time or a plurality of times, or encoded bit sequences transmitted one time or a plurality of times may be repeated, that is, the encoded bit sequences transmitted one time or a plurality of times include a same encoded bit sequence.

TABLE 2

Terrestrial base station or high-altitude platform station

| Index | Data transmission mode |
|---|---|
| 0 | R, R/2, R/4, R/8 |
| 1 | R, R/3, R/6, R/12 |
| 2 | R, R/4, R/8, R/16 |

TABLE 3

Low-orbit satellite

| Index | Data transmission mode |
|---|---|
| 0 | R + R/2, R/4 + R/8, R/2 + R/16 |
| 1 | R + R/2, R/4 + R/6, R/8 + R/10 |
| 2 | R + R/4, R/6 + R/8, R/10 + R/12 |

TABLE 4

Medium-orbit satellite

| Index | Data transmission mode |
|---|---|
| 0 | R + R/2, R/4 + R/8 |
| 1 | R + R/3, R/6 + R/12 |
| 2 | R + R/4, R/8 + R/16 |

TABLE 5

High-orbit satellite

| Index | Data transmission mode |
|---|---|
| 0 | R + R/2 + R/4 + R/8 + R/16 |
| 1 | R + R/3 + R/6 + R/9 + R/12 |
| 2 | R + R/4 + R/8 + R/16 + R/16 |

Similarly, after the terminal learns about the type of the base station, the network device may select a data transmission mode to be used, and send an index corresponding to the selected data transmission mode to the terminal. The terminal searches a corresponding table for determining the target data transmission mode. For example, the network device notifies, by using system information, the terminal that the type of the network device is the high-orbit satellite. The network device selects a data transmission mode corresponding to an index 0, and sends the index 0 to the terminal. After receiving the index 0 sent by the network device, the terminal queries Table 5 corresponding to the high-orbit satellite, and determines that the data transmission mode corresponding to the index 0 is R+R/2+R/4+R/8+R/16, that is, a quantity of transmission times is one, and a transmitted encoded-bit combination includes encoded bit sequences whose code rates are respectively R, R/2, R/4, R/8, and R/16.

Alternatively, the terminal prestores data transmission lists corresponding to different base station types shown in Table 2 to Table 5, and determines, with reference to the type of the network device, a current channel status, the code rate of the terminal, or the like, a data transmission mode to be selected.

It should be noted that one or more encoded bit sequences may be repeatedly sent. For example, in a data transmission mode corresponding to the index 0 in Table 3, an encoded bit sequence whose code rate is R/2 is repeatedly transmitted in the third-time encoding. Moreover, encoded-bit combinations in different times of transmission may include a repeated encoded bit sequence. For another example, in a data transmission mode corresponding to the index 2 in Table 5, five encoded bit sequences are transmitted at a time, and an encoded bit sequence whose code rate is R/16 is repeatedly transmitted.

It should be noted that the tables in the foregoing embodiments are described by using the example in which the code lengths used in the different times of encoding are equal (that is, the code rate may represent the relationship between the quantities of information bits selected in the different times of encoding). When the code lengths used in the different times of encoding are different, the code rate R in the table may be directly replaced with a quantity of information bits. For example, when the code lengths used in the different times of encoding are different, Table 1 may be changed to the following Table 6.

TABLE 6

| Index | Data transmission mode |
|---|---|
| 0 | K |
| 1 | K + K/2 |
| 2 | K + K/3 |
| 3 | K + K/4 |
| 4 | K + K/5 |
| 5 | K + K/2 + K/4 |
| 6 | K + K/2 + K/5 |
| 7 | K + K/3 + K/4 |
| 8 | K + K/3 + K/5 |
| 9 | K + K/2 + K/3 + K/4 |
| 10 | K + K/2 + K/3 + K/5 |
| 11 | K + K/3, K/5 |
| 12 | K + K/2, K/2 + K/4 |
| ... | ... |

It can be learned from Table 6 that, in a data transmission mode corresponding to the index 11, an encoded-bit combination transmitted at the first time includes an encoded bit sequence obtained by encoding the K information bits and an encoded bit sequence obtained by encoding K/3 information bits in the K information bits, and an encoded-bit combination transmitted at the second time includes an encoded bit sequence obtained by encoding K/5 information bits in the K information bits. In a data transmission mode corresponding to the index 12, an encoded-bit combination transmitted at the first time includes an encoded bit sequence obtained by encoding the K information bits and an encoded bit sequence obtained by encoding K/2 information bits in the K information bits, and an encoded-bit combination transmitted at the second time includes an encoded bit sequence obtained by encoding the K/2 information bits in the K information bits and an encoded bit sequence obtained by encoding K/4 information bits in the K information bits. Moreover, a code rate used in each encoding may be the same or may be different. A code length used in each encoding may be the same or may be different.

Figure 9:
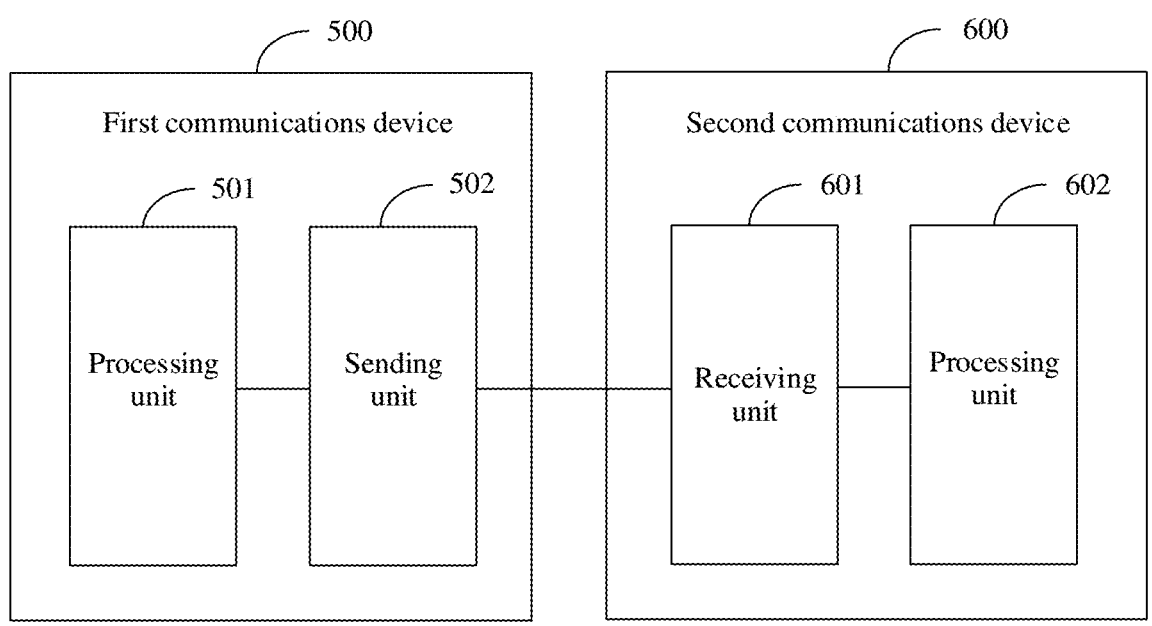
FIG. 9 is a schematic structural diagram of a first communications device and a second communications device according to an embodiment of this application.

FIG. 9 is a functional block diagram of a first communications device 500 and a second communications device 600 according to an embodiment of this application. The first communications device may be the network device 101 or the terminal device 102 in the embodiment in FIG. 1. Correspondingly, the second communications device may be the terminal device 102 or the network device 101 in the embodiment in FIG. 1. Description is separately provided below.

As shown in FIG. 9, the first communications device 500 may include a processing unit 501 and a sending unit 502.

The processing unit 501 is configured to determine a target data transmission mode, where the target data transmission mode is used to indicate a quantity of times that the first communications device transmits an encoded-bit combination to the second communications device and an encoded-bit combination transmitted each time, the encoded-bit combination transmitted each time includes one encoded bit sequence or a plurality of encoded bit sequences, the encoded bit sequence is obtained by encoding all or some of K information bits, and K is a positive integer.

The sending unit 502 is configured to send the encoded-bit combination to the second communications device in the target data transmission mode.

Optionally, an encoded-bit combination in at least one transmission in the encoded-bit combination transmitted each time includes at least two encoded bit sequences.

Optionally, when the encoded-bit combination transmitted each time includes the plurality of encoded bit sequences, at least one of the plurality of encoded bit sequences is obtained by encoding some information bits of the K information bits.

Optionally, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on reliability, when the Q information bits are encoded by using the polar code, to obtain the second encoded bit sequence, the Q information bits are mapped to the first Q polarized channels of the P polarized channels that are sorted based on the reliability, and Q is a positive integer less than or equal to P.

Optionally, the Q information bits are mapped, in ascending reliability order, to the Q polarized channels whose reliability is in descending order, or the Q information bits are mapped, in descending reliability order, to the Q polarized channels whose reliability is in descending order.

Optionally, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on a code distance and reliability, when the Q information bits are encoded by using the polar code, to obtain the second encoded bit sequence, the Q information bits are mapped to the first Q polarized channels of the P polarized channels that are sorted based on the code distance and the reliability, and Q is a positive integer less than or equal to P.

Optionally, the Q information bits are mapped, in ascending code distance and reliability order, to the Q polarized channels whose code distances and reliability are in descending order, or the Q information bits are mapped, in descending code distance and reliability order, to the Q polarized channels whose code distances and reliability are in descending order.

Optionally, the first communications device is a terminal and the second communications device is a network device, or the first communications device is a network device and the second communications device is a terminal, and the first communications device 500 further includes a receiving unit, configured to before the processing unit 501 determines the target data transmission mode, receive a first index sent by the second communications device, where the first index is determined by the second communications device based on attribute information of the network device and/or quality of a channel between the first communications device and the second communications device, the attribute information includes one or more of a type of the network device, a distance between the first communications device and the second communications device, or a height from the network device to the ground, and the type includes a terrestrial base station or a non-terrestrial base station.

That the processing unit 501 is configured to determine a target data transmission mode includes determining the target data transmission mode based on the first index and a preset mapping table, where the preset mapping table includes a mapping relationship between at least one index and at least one data transmission mode, the at least one index includes the first index, and the at least one data transmission mode includes the target data transmission mode.

Optionally, the first communications device is a terminal and the second communications device is a network device, or the first communications device is a network device and the second communications device is a terminal, and that the processing unit 501 is configured to determine a target data transmission mode includes determining the target data transmission mode based on attribute information of the network device and/or quality of a channel between the first communications device and the second communications device, where the attribute information includes one or more of a type of the network device, a distance between the first communications device and the second communications device, or a height from the network device to the ground, and the type includes a terrestrial base station or a non-terrestrial base station.

Optionally, a quantity that is of times of encoded-bit combination transmission and that corresponds to the non-terrestrial base station is less than or equal to a quantity that is of times of encoded-bit combination transmission and that corresponds to the terrestrial base station, and/or a quantity that is of encoded bit sequences included in the encoded-bit combination transmitted each time and that corresponds to the non-terrestrial base station is greater than or equal to a quantity that is of encoded bit sequences included in the encoded-bit combination transmitted each time and that corresponds to the terrestrial base station.

The second communications device 600 may include a receiving unit 601 and a processing unit 602.

The receiving unit 601 is configured to receive an encoded-bit combination sent by the first communications device in a target data transmission mode, where the target data transmission mode is used to indicate a quantity of times that the first communications device transmits the encoded-bit combination to the second communications device and an encoded-bit combination transmitted each time, the encoded-bit combination transmitted each time includes one encoded bit sequence or a plurality of encoded bit sequences, the encoded bit sequence is obtained by encoding all or some of K information bits, and K is a positive integer.

The processing unit 602 is configured to decode the received encoded-bit combination to obtain a decoded bit sequence.

Optionally, an encoded-bit combination in at least one transmission in the encoded-bit combination transmitted each time includes at least two encoded bit sequences.

Optionally, when the encoded-bit combination transmitted each time includes the plurality of encoded bit sequences, at least one of the plurality of encoded bit sequences is obtained by encoding some information bits of the K information bits.

Optionally, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on reliability, when the Q information bits are encoded by using the polar code, to obtain the second encoded bit sequence, the Q information bits are mapped to the first Q polarized channels of the P polarized channels that are sorted based on the reliability, and Q is a positive integer less than or equal to P.

Optionally, the Q information bits are mapped, in ascending reliability order, to the Q polarized channels whose reliability is in descending order, or the Q information bits are mapped, in descending reliability order, to the Q polarized channels whose reliability is in descending order.

Optionally, the encoded bit sequence is obtained by performing encoding by using a polar code, and when the encoded-bit combination in the at least one transmission in the encoded-bit combination transmitted each time includes the at least two encoded bit sequences, the at least two encoded bit sequences include a first encoded bit sequence and a second encoded bit sequence, where the first encoded bit sequence is obtained by encoding P information bits in the K information bits by using the polar code, the P information bits are mapped to P polarized channels, P is a positive integer less than or equal to K, the second encoded bit sequence is obtained by encoding Q information bits in the K information bits by using the polar code, the Q information bits are information bits corresponding to the last Q polarized channels of the polarized channels to which the P information bits are mapped and that are sorted based on a code distance and reliability, when the Q information bits are encoded by using the polar code, to obtain the second encoded bit sequence, the Q information bits are mapped to the first Q polarized channels of the P polarized channels that are sorted based on the code distance and the reliability, and Q is a positive integer less than or equal to P.

Optionally, the Q information bits are mapped, in ascending code distance and reliability order, to the Q polarized channels whose code distances and reliability are in descending order, or the Q information bits are mapped, in descending code distance and reliability order, to the Q polarized channels whose code distances and reliability are in descending order.

Optionally, the first communications device is a terminal and the second communications device is a network device, or the first communications device is a network device and the second communications device is a terminal, and the second communications device 600 further includes a sending unit, configured to before the receiving unit 601 receives the encoded-bit combination sent by the first communications device in the target data transmission mode, send a first index to the first communications device, where the first index is used by the first communications device to determine the target data transmission mode, the first index is determined by the second communications device based on attribute information of the network device and/or quality of a channel between the first communications device and the second communications device, the attribute information includes one or more of a type of the network device, a distance between the first communications device and the second communications device, or a height from the network device to the ground, and the type includes a terrestrial base station or a non-terrestrial base station.

Optionally, the target data transmission mode is determined by the first communications device based on attribute information of the network device and quality of a channel between the first communications device and the second communications device, the attribute information includes one or more of a type of the network device, a distance between the first communications device or the second communications device, or a height from the network device to the ground, and the type includes a terrestrial base station or a non-terrestrial base station.

Optionally, a quantity that is of times of encoded-bit combination transmission and that corresponds to the non-terrestrial base station is less than or equal to a quantity that is of times of encoded-bit combination transmission and that corresponds to the terrestrial base station, and/or a quantity that is of encoded bit sequences included in the encoded-bit combination transmitted each time and that corresponds to the non-terrestrial base station is greater than or equal to a quantity that is of encoded bit sequences included in the encoded-bit combination transmitted each time and that corresponds to the terrestrial base station.

It can be understood that, for specific implementation of the functional units included in the first communications device 500 and the second communications device 600, refer to the foregoing embodiments. Details are not described herein again.

Figure 10:
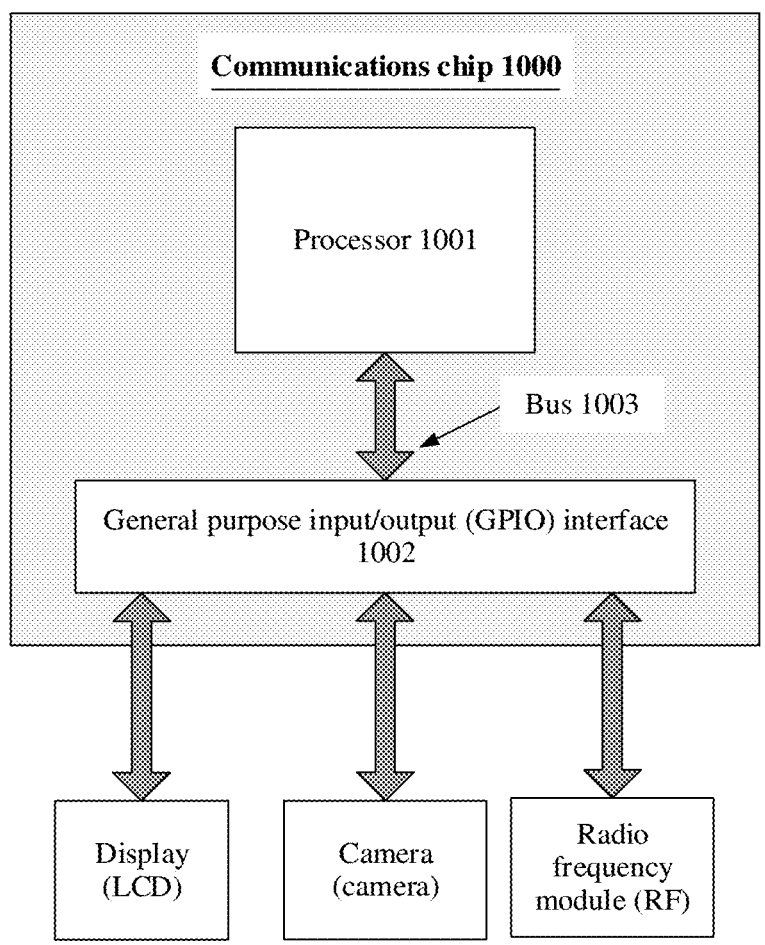
FIG. 10 is a schematic structural diagram of a communications chip according to an embodiment of this application.

FIG. 10 is a schematic structural diagram of a communications chip 1000 provided in this application. As shown in FIG. 10, the communications chip 1000 may include a processor 1001 and one or more interfaces 1002 coupled to the processor 1001. The processor 1001 may be configured to read and execute a computer-readable instruction. In specific implementation, the processor 1001 may mainly include a controller, an arithmetic unit, and a register. The controller is mainly responsible for decoding an instruction, and sends a control signal for an operation corresponding to the instruction. The arithmetic unit is mainly responsible for performing a fixed-point or floating-point arithmetic operation, a shift operation, a logic operation, and the like, and may also perform an address operation and an address conversion. The register is mainly responsible for saving a quantity of register operations temporarily stored during instruction execution, intermediate operation results, and the like. In specific implementation, a hardware architecture of the processor 1001 may be an application-specific integrated circuit (ASIC) architecture, a microprocessor without interlocked piped stages (MIPS) architecture, an advanced reduced instruction set computing machine (ARM) architecture, an NP architecture, or the like. The processor 1001 may have a single core or a plurality of cores.

The interface 1002 may be configured to input to-be-processed data to the processor 1001, and may output a processing result of the processor 1001. In specific implementation, the interface 1002 may be a general purpose input/output (GPIO) interface, and may be connected to a plurality of peripheral devices (for example, a display (LCD), a camera, and a radio frequency (RF) module). The interface 1002 is connected to the processor 1001 by using a bus 1003.

In this application, the processor 1001 may be configured to invoke, from a memory, a program for implementing, on a communications device side, the data transmission method provided in one or more embodiments of this application, and execute an instruction included in the program. The memory may be integrated with the processor 1001, or may be coupled to the communications chip 100 by using the interface 1002. The interface 1002 may be configured to output an execution result of the processor 1001. In this application, the interface 1002 may be specifically configured to output a decoding result of the processor 1001. For the data transmission method provided in one or more embodiments of this application, refer to the foregoing embodiments. Details are not described herein again.

It should be noted that a function corresponding to each of the processor 1001 and the interface 1002 may be implemented by using a hardware design, or may be implemented by using a software design, or may be implemented by combining software and hardware. This is not limited herein.

In the specification, claims, and accompanying drawings of this application, the terms "first", "second", "third", "fourth" and so on are intended to distinguish between different objects but do not indicate a particular order. In addition, the terms "including", "having", or any other variant thereof, are intended to cover a non-exclusive inclusion. For example, a process, method, system, product, or device that includes a series of steps or units is not limited to the listed steps or units, but optionally further includes an unlisted step or unit, or optionally further includes another inherent step or unit of the process, method, product, or device.

All or some of the foregoing embodiments may be implemented by using software, hardware, firmware, or any combination thereof. When the software is used to implement the embodiments, the embodiments may be all or partially implemented in a form of a computer program product. The computer program product includes one or more computer instructions. When the computer program instructions are loaded and executed on a computer, the procedures or functions according to the embodiments of this application are all or partially generated. The computer may be a general purpose computer, a special purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

A person of ordinary skill in the art may understand that all or some of the processes of the methods in the foregoing embodiments may be implemented by a computer program instructing relevant hardware. The program may be stored in a computer-readable storage medium. When the program runs, the processes of the methods in the foregoing embodiments are performed. The foregoing storage medium may be a magnetic disk, an optical disc, a read-only memory (ROM), a random access memory (RAM), or the like.

In the foregoing specific implementations, the objectives, technical solutions, and benefits of the embodiments of this application are further described in detail. It should be understood that the foregoing descriptions are merely specific implementations of the embodiments of this application, but are not intended to limit the protection scope of the embodiments of this application. Any modification, equivalent replacement, or improvement made based on technical solutions of the embodiments of this application shall fall within the protection scope of the embodiments of this application.

What is claimed is:

1. A data transmission method, comprising:
   determining, by a first communications device, a target data transmission mode, wherein the target data transmission mode is associated with a quantity of times that the first communications device transmits an encoded-bit combination to a second communications device and is further associated with the encoded-bit combination transmitted each time, wherein the encoded-bit combination transmitted each time comprises one or more encoded bit sequences, wherein each of the one or more encoded bit sequences is obtained by encoding one or more information bits of K information bits, wherein K is a positive integer, wherein the encoded-bit combination that is transmitted each time comprises at least one transmission having the encoded-bit combination comprising at least two encoded bit sequences, or comprises a plurality of encoded bit sequences with at least one of the plurality of encoded bit sequences obtained by encoding some information bits of the K information bits; and
   sending, by the first communications device, the encoded-bit combination to the second communications device in the target data transmission mode.

2. The method according to claim 1, wherein the encoded bit sequence is obtained by performing encoding by using a polar code; and
   wherein, when the encoded-bit combination in the at least one transmission of the encoded-bit combination transmitted each time comprises the at least two encoded bit sequences, the at least two encoded bit sequences comprise a first encoded bit sequence and a second encoded bit sequence, wherein the first encoded bit sequence is obtained by encoding P information bits in the K information bits by using the polar code, wherein the P information bits are mapped to P polarized channels, wherein P is a positive integer less than or equal to K, wherein the second encoded bit sequence is obtained by encoding Q information bits in the K information bits by using the polar code, wherein the Q information bits are information bits corresponding to the last Q polarized channels of the polarized channels to which the P information bits are mapped and that are sorted based on reliability, wherein, when the Q information bits are encoded by using the polar code to obtain the second encoded bit sequence, the Q information bits are mapped to the first Q polarized channels of the P polarized channels that are sorted based on the reliability, and wherein Q is a positive integer less than or equal to P.

3. The method according to claim 2, wherein the Q information bits are mapped, according to a reliability order of the Q information bits, to the Q polarized channels whose reliability is in descending order.

4. The method according to claim 1, wherein the encoded bit sequence is obtained by performing encoding by using a polar code, wherein, when the encoded-bit combination in the at least one transmission of the encoded-bit combination transmitted each time comprises the at least two encoded bit sequences, wherein the at least two encoded bit sequences comprise a first encoded bit sequence and a second encoded bit sequence, wherein the first encoded bit sequence is obtained by encoding P information bits in the K information bits by using the polar code, wherein the P information bits are mapped to P polarized channels, wherein P is a positive integer less than or equal to K, wherein the second encoded bit sequence is obtained by encoding Q information bits in the K information bits by using the polar code, wherein the Q information bits are information bits corresponding to the last Q polarized channels of the polarized channels to which the P information bits are mapped and that are sorted based on a code distance and reliability, wherein, when the Q information bits are encoded by using the polar code to obtain the second encoded bit sequence, the Q information bits are mapped to the first Q polarized channels of the P polarized channels that are sorted based on the code distance and the reliability, and wherein Q is a positive integer less than or equal to P.

5. The method according to claim 4, wherein the Q information bits are mapped, in one of ascending code distance and reliability order or descending code distance and reliability order, to the Q polarized channels whose code distances and reliability are in descending order.

6. The method according to claim 1, wherein the first communications device is one of a terminal or a network device, and wherein the second communications device is an other one of the terminal or the network device;
wherein the method further comprises performing, before the determining, by the first communications device, the target data transmission mode:
receiving, by the first communications device, a first index sent by the second communications device, wherein the first index is determined by the second communications device based on at least one of attribute information of the network device or quality of a channel between the first communications device and the second communications device, wherein the attribute information comprises one or more of a type of the network device, a distance between the first communications device and the second communications device, or a height from the network device to the ground, and wherein the type comprises a terrestrial base station or a non-terrestrial base station; and
wherein the determining, by the first communications device, the target data transmission mode comprises:
determining, by the first communications device, the target data transmission mode based on the first index and a preset mapping table, wherein the preset mapping table comprises a mapping relationship between at least one index and at least one data transmission mode, wherein the at least one index comprises the first index, and wherein the at least one data transmission mode comprises the target data transmission mode.

7. The method according to claim 1, wherein the first communications device is one of a terminal or a network device, and wherein the second communications device is an other one of the terminal or the network device; and
wherein the determining, by the first communications device, a target data transmission mode comprises:
determining, by the first communications device, the target data transmission mode based on at least one of attribute information of the network device or quality of a channel between the first communications device and the second communications device, wherein the attribute information comprises one or more of a type of the network device, a distance between the first communications device and the second communications device, or a height from the network device to the ground, and wherein the type comprises a terrestrial base station or a non-terrestrial base station.

8. The method according to claim 7, wherein a quantity that is of times of encoded-bit combination transmission and that corresponds to the non-terrestrial base station is less than or equal to a quantity that is of times of encoded-bit combination transmission and that corresponds to the terrestrial base station; or
wherein a quantity that is of encoded bit sequences of the encoded-bit combination transmitted each time and that corresponds to the non-terrestrial base station is greater than or equal to a quantity that is of encoded bit sequences of the encoded-bit combination transmitted each time and that corresponds to the terrestrial base station.

9. A data transmission method, comprising:
receiving, by a second communications device, an encoded-bit combination sent by a first communications device in a target data transmission mode, wherein the target data transmission mode is associated with a quantity of times that the first communications device transmits the encoded-bit combination to the second communications device and is further associated with an encoded-bit combination transmitted each time, wherein the encoded-bit combination transmitted each time comprises one or more encoded bit sequences, wherein the one or more encoded bit sequences are obtained by encoding all or some of K information bits, wherein K is a positive integer, and wherein the encoded-bit combination that is transmitted each time comprises at least one transmission having the encoded-bit combination comprising at least two encoded bit sequences, or comprises a plurality of encoded bit sequences with at least one of the plurality of encoded bit sequences obtained by encoding some information bits of the K information bits; and
decoding, by the second communications device, the received encoded-bit combination to obtain a decoded bit sequence.

10. The method according to claim 9, wherein the encoded bit sequence is obtained by performing encoding by using a polar code, wherein, when the encoded-bit combination in the at least one transmission in the encoded-bit combination transmitted each time comprises the at least two encoded bit sequences, wherein the at least two encoded bit sequences comprise a first encoded bit sequence and a second encoded bit sequence, wherein the first encoded bit sequence is obtained by encoding P information bits in the K information bits by using the polar code, wherein the P information bits are mapped to P polarized channels, wherein P is a positive integer less than or equal to K, wherein the second encoded bit sequence is obtained by encoding Q information bits in the K information bits by using the polar code, wherein the Q information bits are information bits corresponding to the last Q polarized channels of the polarized channels to which the P information bits are mapped and that are sorted based on reliability, wherein, when the Q information bits are encoded by using the polar code to obtain the second encoded bit sequence, wherein the Q information bits are mapped to the first Q polarized channels of the P polarized channels that are sorted based on the reliability, and wherein Q is a positive integer less than or equal to P.

11. The method according to claim 10, wherein the Q information bits are mapped, according to a reliability order of the Q information bits, to the Q polarized channels whose reliability is in descending order.

12. The method according to claim 9, wherein the encoded bit sequence is obtained by performing encoding by using a polar code, wherein when the encoded-bit combination in the at least one transmission of the encoded-bit combination transmitted each time comprises the at least two encoded bit sequences, wherein the at least two encoded bit sequences comprise a first encoded bit sequence and a second encoded bit sequence, wherein the first encoded bit sequence is obtained by encoding P information bits in the K information bits by using the polar code, wherein the P information bits are mapped to P polarized channels, wherein P is a positive integer less than or equal to K, wherein the second encoded bit sequence is obtained by encoding Q information bits in the K information bits by using the polar code, wherein the Q information bits are information bits corresponding to the last Q polarized channels of the polarized channels to which the P information bits are mapped and that are sorted based on a code distance and reliability, wherein, when the Q information bits are encoded by using the polar code to obtain the second encoded bit sequence, the Q information bits are mapped to the first Q polarized channels of the P polarized channels that are sorted based on the code distance and the reliability, and wherein Q is a positive integer less than or equal to P.

13. The method according to claim 12, wherein the Q information bits are mapped, in one of ascending code distance and reliability order or descending code distance and reliability order, to the Q polarized channels whose code distances and reliability are in descending order.

14. The method according to claim 9, wherein the first communications device is one of a terminal or a network device, and wherein the second communications device is another one of the terminal or the network device;
wherein the method comprises performing, before the receiving, by the second communications device, an encoded-bit combination sent by the first communications device in a target data transmission mode:
sending, by the second communications device, a first index to the first communications device, wherein the first index is used by the first communications device to determine the target data transmission mode, wherein the first index is determined by the second communications device based on at least one of attribute information of the network device or a quality of a channel between the first communications device and the second communications device, wherein the attribute information comprises one or more of a type of the network device, a distance between the first communications device and the second communications device, or a height from the network device to the ground, and wherein the type comprises a terrestrial base station or a non-terrestrial base station.

15. The method according to claim 9, wherein the target data transmission mode is determined by the first communications device based on at least one of attribute information of a network device or a quality of a channel between the first communications device and the second communications device, wherein the attribute information comprises one or more of a type of the network device, a distance between the first communications device and the second communications device, or a height from the network device to the ground, and wherein the type comprises a terrestrial base station or a non-terrestrial base station.

16. The method according to claim 15, wherein a quantity that is of times of encoded-bit combination transmission and that corresponds to the non-terrestrial base station is less than or equal to a quantity that is of times of encoded-bit combination transmission and that corresponds to the terrestrial base station; or
wherein a quantity that is of encoded bit sequences comprised in the encoded-bit combination transmitted each time and that corresponds to the non-terrestrial base station is greater than or equal to a quantity that is of encoded bit sequences comprised in the encoded-bit combination transmitted each time and that corresponds to the terrestrial base station.

17. A communications device, comprising:
at least one processor; and
at least one non-transitory memory coupled to the at least one processor and storing a program for execution by the at least one processor, the program including instructions to:
determine a target data transmission mode, wherein the target data transmission mode is associated with a quantity of times that a first communications device transmits an encoded-bit combination to a second communications device and is further associated with an encoded-bit combination transmitted each time, wherein the encoded-bit combination transmitted each time comprises one encoded bit sequence or a plurality of encoded bit sequences, wherein the encoded bit sequence is obtained by encoding all or some of K information bits, wherein K is a positive integer, and wherein the encoded-bit combination that is transmitted each time comprises at least one transmission having the encoded-bit combination comprising at least two encoded bit sequences, or comprises a plurality of encoded bit sequences with at least one of the plurality of encoded bit sequences obtained by encoding some information bits of the K information bits; and
send the encoded-bit combination to the second communications device in the target data transmission mode.

18. A communications device, comprising:
at least one processor; and
at least one non-transitory memory coupled to the at least one processor and storing a program for execution by the at least one processor, the program including instructions to:
receive an encoded-bit combination sent by a first communications device in a target data transmission mode, wherein the target data transmission mode is associated with a quantity of times that the first communications device transmits the encoded-bit combination to a second communications device and is further associated with an encoded-bit combination transmitted each time, wherein the encoded-bit combination transmitted each time comprises one encoded bit sequence or a plurality of encoded bit sequences, wherein the encoded bit sequence is obtained by encoding all or some of K information bits, wherein K is a positive integer, and wherein the encoded-bit combination that is transmitted each time comprises at least one transmission having the encoded-bit combination comprising at least two encoded bit sequences, or comprises a plurality of encoded bit sequences with at least one of the plurality of encoded bit sequences obtained by encoding some information bits of the K information bits; and decode the received encoded-bit combination to obtain a decoded bit sequence.

* * * * *